(12) United States Patent
Nishii

(10) Patent No.: US 8,300,207 B2
(45) Date of Patent: Oct. 30, 2012

(54) EXPOSURE APPARATUS, IMMERSION SYSTEM, EXPOSING METHOD, AND DEVICE FABRICATING METHOD

(75) Inventor: Yasufumi Nishii, Kumagaya (JP)

(73) Assignee: Nikon Corporation, Tokyo (JP)

( * ) Notice: Subject to any disclaimer, the term of this patent is extended or adjusted under 35 U.S.C. 154(b) by 708 days.

(21) Appl. No.: 12/149,878

(22) Filed: May 9, 2008

(65) Prior Publication Data

US 2008/0284991 A1    Nov. 20, 2008

Related U.S. Application Data

(60) Provisional application No. 60/924,489, filed on May 17, 2007.

(51) Int. Cl.
*G03B 27/52* (2006.01)
(52) U.S. Cl. .......................... 355/30; 355/53
(58) Field of Classification Search .............. 355/30, 355/53
See application file for complete search history.

(56) References Cited

U.S. PATENT DOCUMENTS

| | | | |
|---|---|---|---|
| 5,969,441 A | 10/1999 | Loopstra et al. | |
| 6,208,407 B1 | 3/2001 | Loopstra | |
| 6,262,796 B1 | 7/2001 | Loopstra et al. | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,590,698 B1 | 7/2003 | Ohtsuki et al. | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 7,023,610 B2 | 4/2006 | Ohtsuki et al. | |
| 2002/0123012 A1 | 9/2002 | Sewell | |
| 2006/0023182 A1 | 2/2006 | Novak et al. | |
| 2006/0023187 A1 | 2/2006 | Eaton | |
| 2006/0158628 A1* | 7/2006 | Liebregts et al. | 355/53 |
| 2007/0110213 A1 | 5/2007 | Leenders et al. | |
| 2007/0296939 A1 | 12/2007 | Nishii | |
| 2008/0068567 A1 | 3/2008 | Nagasaka et al. | |

FOREIGN PATENT DOCUMENTS

| | | |
|---|---|---|
| EP | 0-951-054 A1 | 10/1999 |
| EP | 1-041-357 A1 | 10/2000 |
| EP | 1-063-742 A1 | 12/2000 |
| EP | 1 681 596 A1 | 7/2006 |
| EP | 1 768 169 A1 | 3/2007 |
| EP | 1 768 170 A1 | 3/2007 |

(Continued)

OTHER PUBLICATIONS

International Search Report dated Aug. 11, 2008 issued for Application No. PCT/JP2008/059290.

(Continued)

*Primary Examiner* — Toan Ton
*Assistant Examiner* — Mesfin T Asfaw
(74) *Attorney, Agent, or Firm* — Oliff & Berridge, PLC

(57) ABSTRACT

An exposure apparatus exposes a substrate with exposure light through a liquid. The exposure apparatus comprises: a liquid immersion member, which has a liquid contact surface that includes a liquid recovery area; and a porous member, which are disposed at a first side of the liquid contact surface; wherein, the liquid on an object, which is disposed at the first side of the liquid contact surface, is recovered from the liquid recovery area.

43 Claims, 17 Drawing Sheets

FOREIGN PATENT DOCUMENTS

| | | |
|---|---|---|
| EP | 1 768 171 A1 | 3/2007 |
| EP | 1 865 542 A1 | 12/2007 |
| EP | 1 873 815 A1 | 1/2008 |
| JP | A-10-163099 | 6/1998 |
| JP | A-10-214783 | 8/1998 |
| JP | A-11-135400 | 5/1999 |
| JP | A-2000-505958 | 5/2000 |
| JP | A-2000-164504 | 6/2000 |
| JP | A-2004-519850 | 7/2004 |
| WO | WO-98/28655 | 7/1998 |
| WO | WO-99/23692 | 5/1999 |
| WO | WO 99/23692 AI | 5/1999 |
| WO | WO 99/46835 A1 | 9/1999 |
| WO | WO 99/49504 A1 | 9/1999 |
| WO | WO 01/35168 A1 | 5/2001 |
| WO | WO 2004/019128 A2 | 3/2004 |
| WO | WO 2005/024517 A2 | 3/2005 |
| WO | WO 2005/05 96 1 | 6/2005 |
| WO | WO 2005/059617 A2 | 6/2005 |
| WO | WO 2005/119742 A1 | 12/2005 |
| WO | WO 2005/122220 A1 | 12/2005 |
| WO | WO 2005/122221 A1 | 12/2005 |
| WO | WO 2006/106851 AI | 10/2006 |
| WO | WO 2006/106907 | 10/2006 |

OTHER PUBLICATIONS

Written Opinion dated Aug. 11, 2008 issued for Application No. PCT/JP2008/059290.

* cited by examiner

EXPOSURE APPARATUS, IMMERSION SYSTEM, EXPOSING METHOD, AND DEVICE FABRICATING METHOD

CROSS-REFERENCE TO RELATED APPLICATION

This application is a non-provisional application claiming priority to and the benefit of U.S. provisional application No. 60/924,489, filed May 17, 2007, the entire contents of which are incorporated herein by reference.

BACKGROUND

1. Field of the Invention

The present invention relates to an exposure apparatus, an immersion system, an exposing method, and a device fabricating method.

2. Description of Related Art

As disclosed in PCT International Publication WO99/049504, and PCT International Publication WO2006/106907 (corresponding to European Patent Application, Publication No. 1,873,815), among exposure apparatuses used in photolithography, an immersion exposure apparatus is known that exposes a substrate with exposure light through a liquid.

With an immersion exposure apparatus, if a substrate is moved at high speed, then there is a possibility that it will become difficult to fill an optical path space of the exposure light between the substrate and an optical member of, for example, a projection optical system with a liquid in a desired state. In addition, if the substrate is moved at high speed, then there is a possibility that the liquid will leak or remain on the substrate. Therefore, there is a possibility that exposure failures will occur such as the generation of defects in the pattern that is formed on the substrate. As a result, there is a possibility that defective devices will be fabricated.

A purpose of some aspects of the invention is to provide an immersion exposure apparatus that can prevent exposure failures, and an exposing method. Another purpose is to provide an immersion system that prevents the liquid from leaking or remaining. Yet another purpose is to provide a device fabricating method that can prevent defective devices from being produced.

SUMMARY

A first aspect of the invention provides an exposure apparatus that exposes a substrate with exposure light through a liquid, and comprises: a liquid immersion member which has a liquid contact surface that includes a liquid recovery area; and a porous member, which is disposed at a first side of the liquid contact surface; wherein, the liquid on an object, which is disposed at the first side of the liquid contact surface and faces the liquid contact surface, is recovered from the liquid recovery area.

A second aspect of the invention provides an exposure apparatus that exposes a substrate with exposure light through a liquid, and comprises: a liquid supply port that supplies the liquid; a liquid immersion member; a porous member, which opposes the liquid immersion member; and a space, which is provided between the liquid immersion member and the porous member, into which at least part of the liquid that is supplied from the liquid supply port can flow without going through the porous member.

A third aspect of the invention provides an exposure apparatus that exposes a substrate with exposure light through a liquid, and comprises: a liquid supply port that supplies the liquid; a first member which has a liquid contact surface that includes a liquid recovery area; and a second member, which is disposed at a first side of the liquid contact surface; wherein, the surface of the second member is made lyophilic by bringing the liquid that is supplied from the liquid supply ports into contact with the second member, and the liquid on an object, which is disposed at the first side of the liquid contact surface and faces the liquid contact surface, is recovered from the liquid recovery area.

A fourth aspect of the invention according to the first, second, and third aspects provides a device fabricating method that comprises the steps of: exposing a substrate using an exposure apparatus according to the first, the second, and the third aspects; and developing the exposed substrate.

A fifth aspect of the invention provides an immersion system that is used by an immersion exposure apparatus, which exposes a substrate with exposure light from an optical member, to fill an optical path of the exposure light between the optical member and the substrate with a liquid, and comprises: a liquid immersion member which has a liquid contact surface that includes a liquid recovery area; and a porous member, which is disposed at a first side of the liquid contact surface; wherein, the liquid on an object, which is disposed at the first side of the liquid contact surface and opposes the liquid contact surface, is recovered from the liquid recovery area.

A sixth aspect of the invention provides an immersion system that is used by an immersion exposure apparatus, which exposes a substrate with exposure light from an optical member, to fill an optical path of the exposure light between the optical member and the substrate with a liquid, and comprises: a liquid supply port that supplies the liquid; a liquid immersion member; a porous member, which opposes the liquid immersion member; and a space, which is provided between the liquid immersion member and the porous member, into which at least part of the liquid that is supplied from the liquid supply port can flow without going through the porous member.

A seventh aspect of the invention provides an immersion system that is used by an immersion exposure apparatus, which exposes a substrate with exposure light from an optical member, to fill an optical path of the exposure light between the optical member and the substrate with a liquid, and comprises: a liquid supply port that supplies the liquid; a first member, which has a liquid contact surface that includes a liquid recovery area; and a second member, which is disposed at a first side of the liquid contact surface; wherein, the surface of the second member is made lyophilic by bringing the liquid that is supplied from the liquid supply port into contact with the second member, and the liquid on an object, which is disposed at the first side of the liquid contact surface and faces the liquid contact surface, is recovered from the liquid recovery area.

An eighth aspect of the invention provides an immersion system that is used by an immersion exposure apparatus, which exposes a substrate with exposure light from an optical member, to fill an optical path of the exposure light between the optical member and the substrate with a liquid, and comprises: a liquid immersion member which has a liquid contact surface that includes a liquid recovery area; and a film forming member, which is disposed at a first side of the liquid contact surface, that forms a thin film of the liquid so that it opposes the object; wherein, the liquid on an object, which is disposed at the first side of the liquid contact surface and faces the liquid contact surface, is recovered from the liquid recovery area.

A ninth aspect of the invention provides an exposing method that exposes a substrate with exposure light through a liquid, and comprises: disposing the substrate adjacent to a liquid contact surface, which includes a liquid recovery area and a liquid nonrecovery area; holding part of the liquid that is supplied from a liquid supply port between the liquid contact surface and the substrate using a porous member, which is positioned between the liquid contact surface and the substrate; and recovering the liquid on the substrate from the liquid recovery area.

A tenth aspect of the invention provides a device fabricating method that comprises the steps of: exposing the substrate using an exposing method according to the ninth aspect; and developing the exposed substrate.

The some aspects of the present invention can prevent exposure failures from occurring. In addition, the some aspects of the present invention can prevent defective devices from being produced.

DESCRIPTION OF EMBODIMENTS

The following explains the embodiments of the present invention referencing the drawings, but the present invention is not limited thereto. Furthermore, the following explanation defines an XYZ orthogonal coordinate system, and the positional relationships among members are explained referencing this system. Furthermore, prescribed directions within the horizontal plane are the X axial directions, the directions that are orthogonal to the X axial directions in the horizontal plane are the Y axial directions, and the directions that are orthogonal to the X axial directions and the Y axial directions (i.e., the vertical directions) are the Z axial directions. In addition, the rotational (the inclined) directions around the X, Y, and Z axes are the $\theta X$, $\theta Y$, and $\theta Z$ directions, respectively.

First Embodiment

Figure 1:
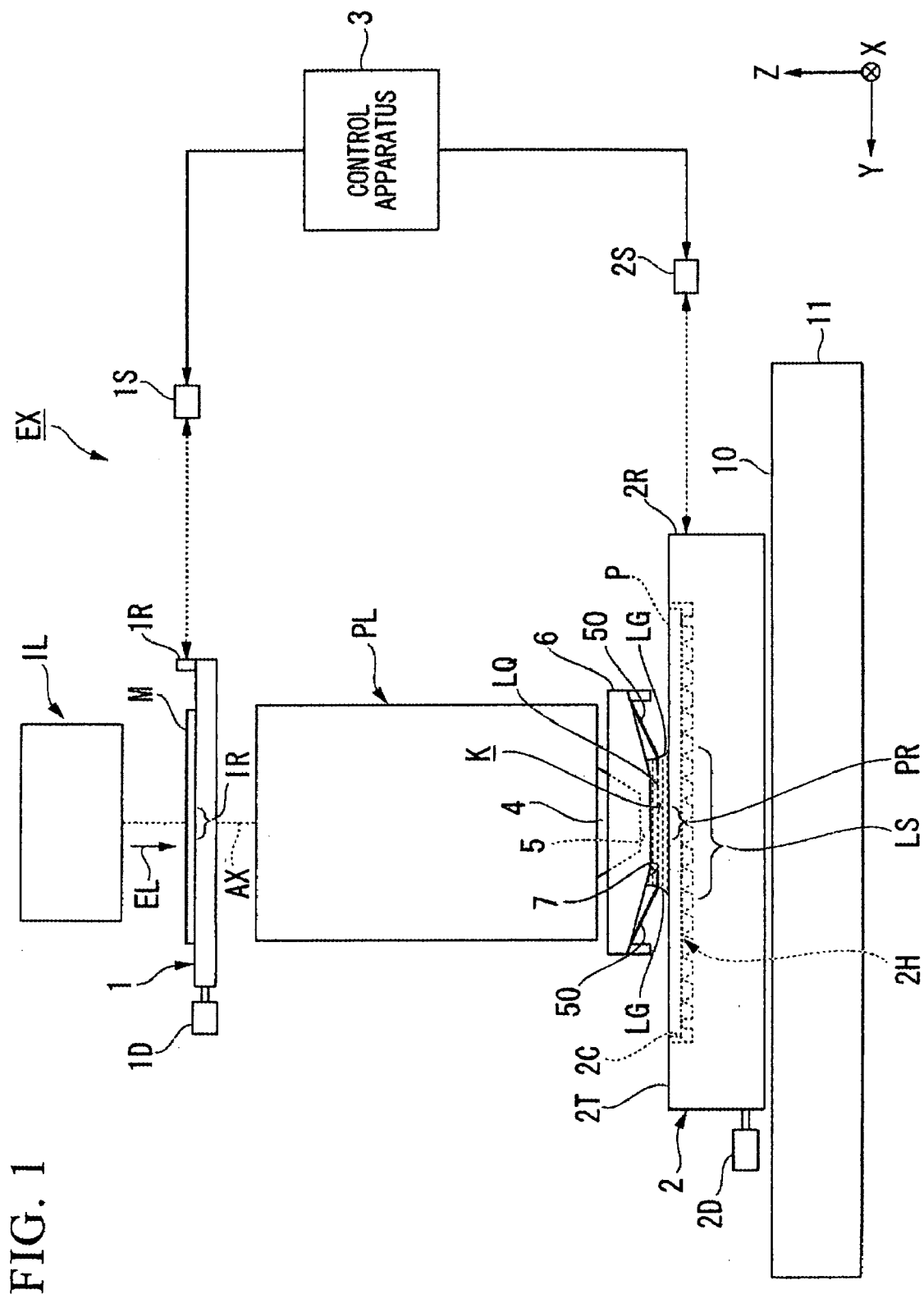
FIG. 1 is a schematic block diagram that shows one example of an exposure apparatus according to a first embodiment.

A first embodiment will now be explained. FIG. 1 is a schematic block diagram that shows one example of an exposure apparatus EX according to the first embodiment. In FIG. 1, the exposure apparatus EX comprises a movable mask stage 1 that holds a mask M, a movable substrate stage 2 that holds a substrate P, an illumination system IL, which illuminates the mask M with exposure light EL, a projection optical system PL, which projects an image of a pattern of the mask M that is illuminated by the exposure light EL onto the substrate P, and a control apparatus 3 that controls the operation of the entire exposure apparatus EX.

Furthermore, the substrate P referenced herein is a substrate for fabricating a device and includes a substrate wherein a photosensitive film is formed on a base material such as a semiconductor wafer, e.g., a silicon wafer. The photosensitive film is a film of a photosensitive material (photoresist). Various films, such as a protective film (topcoat film), may be formed on the substrate P in addition to the photosensitive film. The mask M includes a reticle wherein a device pattern that is to be projected to the substrate P is formed, e.g., one wherein a prescribed pattern is formed using a light shielding film of chrome or the like, on a transparent plate member such as a glass plate. This light transmitting type mask is not limited to a binary mask wherein a pattern is formed with a light shielding film, but may also include, for example, a halftone type or a spatial frequency modulation type phase shift mask. In addition, a transmitting type mask is used as the mask M in the present embodiment, but a reflecting type mask may also be used.

The exposure apparatus EX of the present embodiment is an immersion exposure apparatus that exposes the substrate P with the exposure light EL through a liquid LQ and forms an immersion space LS so that at least part of an optical path space K of the exposure light EL is filled with the liquid LQ. Furthermore, the optical path space K of the exposure light EL is a space that includes the optical path through which the exposure light EL passes. The immersion space LS is a space that is filled with the liquid LQ. In the present embodiment, water (pure water) is used as the liquid LQ.

In the present embodiment, the immersion space LS is formed so that the optical path space K on the image plane side of a last optical element 4, which is the optical element of a plurality of optical elements of the projection optical system PL that is closest to the image plane of the projection optical system PL, is filled with the liquid LQ. The last optical element 4 comprises an emergent surface (lower surface) 5 that emits the exposure light EL toward the image plane of the projection optical system PL. The immersion space LS is formed so that the optical path space K on the emergent side (the image plane side) of the last optical element 4 is filled with the liquid LQ. Specifically, the immersion space LS is formed so that the liquid LQ fills the optical path space K between the last optical element 4 and an object that is disposed at a position at which it opposes the emergent surface 5 of the last optical element 4. The liquid LQ of the immersion space LS contacts the emergent surface 5 of the last optical element 4. The position at which the object opposes the emergent surface 5 of the last optical element 4 includes a position at which the object can be irradiated by the exposure light EL.

The exposure apparatus EX comprises a liquid immersion member 6 that is capable of forming the immersion space LS. The liquid immersion member 6 is disposed in the vicinity of the last optical element 4. The liquid immersion member 6 has a liquid contact surface (lower surface) 7, which the liquid LQ of the immersion space LS contacts. In the present embodiment, the object that is capable of opposing the emergent surface 5 of the last optical element 4 is capable of opposing the liquid contact surface 7 of the liquid immersion member 6. When the front surface of the object is disposed at a position at which it opposes the emergent surface 5 of the last optical element 4, the front surface of the object and at least part of the liquid contact surface 7 of the liquid immersion member 6 are opposed. When the emergent surface 5 of the last optical element 4 and the front surface of the object are opposed, the space between the emergent surface 5 of the last optical element 4 and the front surface of the object can hold the liquid LQ. In addition, when the liquid contact surface 7 of the liquid immersion member 6 and the front surface of the object are opposed, the space between the liquid contact surface 7 of the liquid immersion member 6 and the front surface of the object can hold the liquid LQ. Holding the liquid LQ between the front surface of the object on one side and the emergent surface 5 of the last optical element 4 and the liquid contact surface 7 of the liquid immersion member 6 on the other side forms the immersion space LS so that the optical path space K between the emergent surface 5 of the last optical element 4 and the front surface of the object is filled with the liquid LQ.

In the present embodiment, the object that is capable of opposing the emergent surface 5 of the last optical element 4 and the liquid contact surface 7 of the liquid immersion member 6 includes an object that is capable of moving at the emergent side (the image plane side) of the last optical element 4, as well as an object that is capable of moving to the position at which it opposes the emergent surface 5 of the last optical element 4 and the liquid contact surface 7 of the liquid immersion member 6. In the present embodiment, the object that is capable of opposing the emergent surface 5 of the last optical element 4 and the liquid contact surface 7 of the liquid immersion member 6 includes at least one of the substrate stage 2 and the substrate P that is held thereby. Furthermore, to simplify the explanation, the following principally explains an exemplary state wherein the substrate P opposes the emergent surface 5 of the last optical element 4 as well as the liquid contact surface 7 of the liquid immersion member 6.

The exposure apparatus EX of the present embodiment comprises porous members 50, which are disposed at the −Z side (the substrate P side) of the liquid contact surface 7 of the liquid immersion member 6. The front surface of the substrate P is capable of opposing the porous members 50. The porous members 50 oppose at least part of the liquid contact surface 7 of the liquid immersion member 6.

In the present embodiment, the immersion space LS is formed so that part of the area (a local area) of the front surface of the substrate P, which is disposed at a position at which it opposes the emergent surface 5 of the last optical element 4 as well as the liquid contact surface 7 of the liquid immersion member 6, is covered by the liquid LQ, and an interface (meniscus, edge) LG of the liquid LQ is formed between the front surface of the substrate P and the liquid contact surface 7 of the liquid immersion member 6. Namely, the exposure apparatus EX of the present embodiment adopts a local liquid immersion system wherein the immersion space LS is formed so that part of the area on the substrate P that includes a projection region PR of the projection optical system PL is covered with the liquid LQ during the exposure of the substrate P. The state of the interface LG is not limited to the aspect shown in the figures.

The illumination system IL illuminates a prescribed illumination region 1R on the mask M with the exposure light EL, which has uniform luminous flux intensity distribution. Examples of light that can be used as the exposure light EL emitted from the illumination system IL include: deep ultraviolet (DUV) light such as bright line (g-line, h-line, or i-line) light emitted from, for example, a mercury lamp, and KrF excimer laser light (248 nm wavelength); and vacuum ultraviolet (VUV) light such as ArF excimer laser light (193 nm wavelength) and $F_2$ laser light (157 nm wavelength). In the present embodiment, ArF excimer laser light, which is ultraviolet light (vacuum ultraviolet light), is used as the exposure light EL.

The mask stage 1, in the state wherein it holds the mask M, is movable in the X axial, Y axial, and θZ directions by a first drive system 1D that comprises actuators, e.g., linear motors. Laser interferometers 1S measure positional information of the mask stage 1 (the mask M) in the X axial, Y axial, and θZ directions. The laser interferometers 1S measure the positional information using reflecting mirrors 1R, which are provided to the mask stage 1. Based on the measurement results of the laser interferometers 1S, the control apparatus 3 controls the position of the mask M, which is held by the mask stage 1, by driving the first drive system 1D.

The projection optical system PL projects an image of the pattern of the mask M to the substrate P at a prescribed projection magnification. A lens barrel holds the plurality of optical elements of the projection optical system PL. The projection optical system PL of the present embodiment is a reduction system that has a projection magnification of, for example, ¼, ⅕, or ⅛. Furthermore, the projection optical system PL may be a reduction system, a unity magnification system or an enlargement system. In the present embodiment, an optical axis AX of the projection optical system PL is parallel to the Z axis. In addition, the projection optical system PL may be: a dioptric system that does not include catoptric elements; a catoptric system that does not include dioptric elements; or a catadioptric system that includes both catoptric elements and dioptric elements. In addition, the projection optical system PL may form either an inverted image or an erect image.

The substrate stage 2, in the state wherein it holds the substrate P, can be moved in six directions, i.e., in the X axial, Y axial, Z axial, θX, θY, and θZ directions, by a second drive system 2D that comprises actuators, e.g., linear motors. Laser interferometers 2S measure positional information of the substrate stage 2 (the substrate P) in the X axial, the Y axial, and the θZ directions. The laser interferometers 2S measure the positional information using reflecting mirrors 2R, which are provided to the substrate stage 2. In addition, a focus and level detection system (not shown) detects the surface position information (positional information in the Z axial, θX, and θY directions) of the front surface of the substrate P, which is held by the substrate stage 2. Based on the measurement results of the laser interferometers 2S and the detection results of the focus and level detection system, the control apparatus 3 controls the position of the substrate P, which is held by the substrate stage 2, by driving the second drive system 2D.

The substrate stage 2 comprises a substrate holder 2H, which holds the substrate P, and an upper surface 2T, which is disposed around the substrate holder 2H and is capable of opposing the emergent surface 5 of the last optical element 4 and the liquid contact surface 7 of the liquid immersion member 6. The substrate holder 2H is disposed in a recessed part 2C, which is provided in the substrate stage 2. The substrate holder 2H holds the substrate P so that the front surface thereof and the XY plane are substantially parallel. The front surface of the substrate P, which is held by the substrate holder 2H, is capable of opposing the emergent surface 5 of the last optical element 4 and the liquid contact surface 7 of the liquid immersion member 6. In addition, the upper surface 2T of the substrate stage 2 is a flat surface that is substantially parallel to the XY plane. The front surface of the substrate P, which is held by the substrate holder 2H, and the upper surface 2T of the substrate stage 2 are disposed in substantially the same plane and are substantially flush. The upper surface 2T is formed from a material that includes, for example, fluorine, and is therefore liquid repellent with respect to the liquid LQ. The contact angle of the liquid LQ with respect to the upper surface 2T can be, for example, equal to or greater than about 70, 80, 90, 100, 110, 120, 130, or 140°.

The exposure apparatus EX comprises a base plate 11, which comprises a guide surface 10 that movably supports the substrate stage 2. In the present embodiment, the guide surface 10 is substantially parallel to the XY plane. The substrate stage 2 is capable of moving along the guide surface 10 in the X and Y directions (the two dimensional directions).

The exposure apparatus EX of the present embodiment is a scanning type exposure apparatus (a so-called scanning stepper) that projects the image of the pattern of the mask M onto the substrate P while synchronously moving the mask M and the substrate P in prescribed scanning directions. During the exposure of the substrate P, the mask M and the substrate P are moved in the prescribed scanning directions within an XY plane that intersects the optical axis AX (the optical path of the exposure light EL) of the projection optical system PL, which is substantially parallel to the Z axis. In the present embodiment, the scanning directions (the synchronous movement directions) of the substrate P and the mask M are the Y axial directions. The exposure apparatus EX moves the substrate P in one of the Y axial directions with respect to the projection region PR of the projection optical system PL, and radiates the exposure light EL onto the substrate P through the projection optical system PL and the liquid LQ in the immersion space LS on the substrate P while moving the mask M in one of the Y axial directions with respect to the illumination region 1R of the illumination system IL synchronized to the movement of the substrate P. Thereby, the image of the pattern of the mask M is projected onto the substrate P, which is thereby exposed with the exposure light EL.

Figure 2:
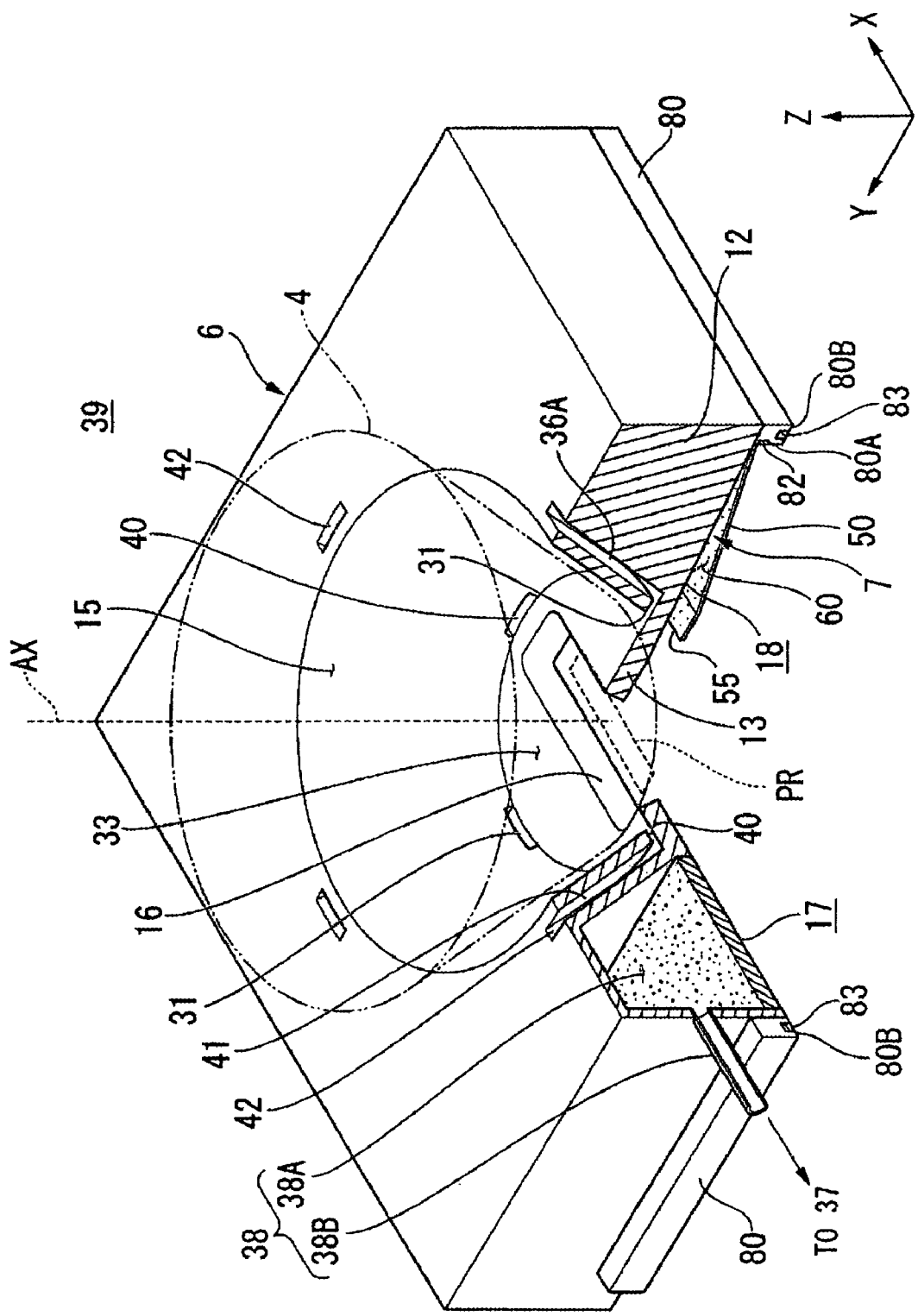
FIG. 2 is a partial, broken, schematic, oblique view that shows the vicinity of a liquid immersion member according to the first embodiment.
Figure 3:
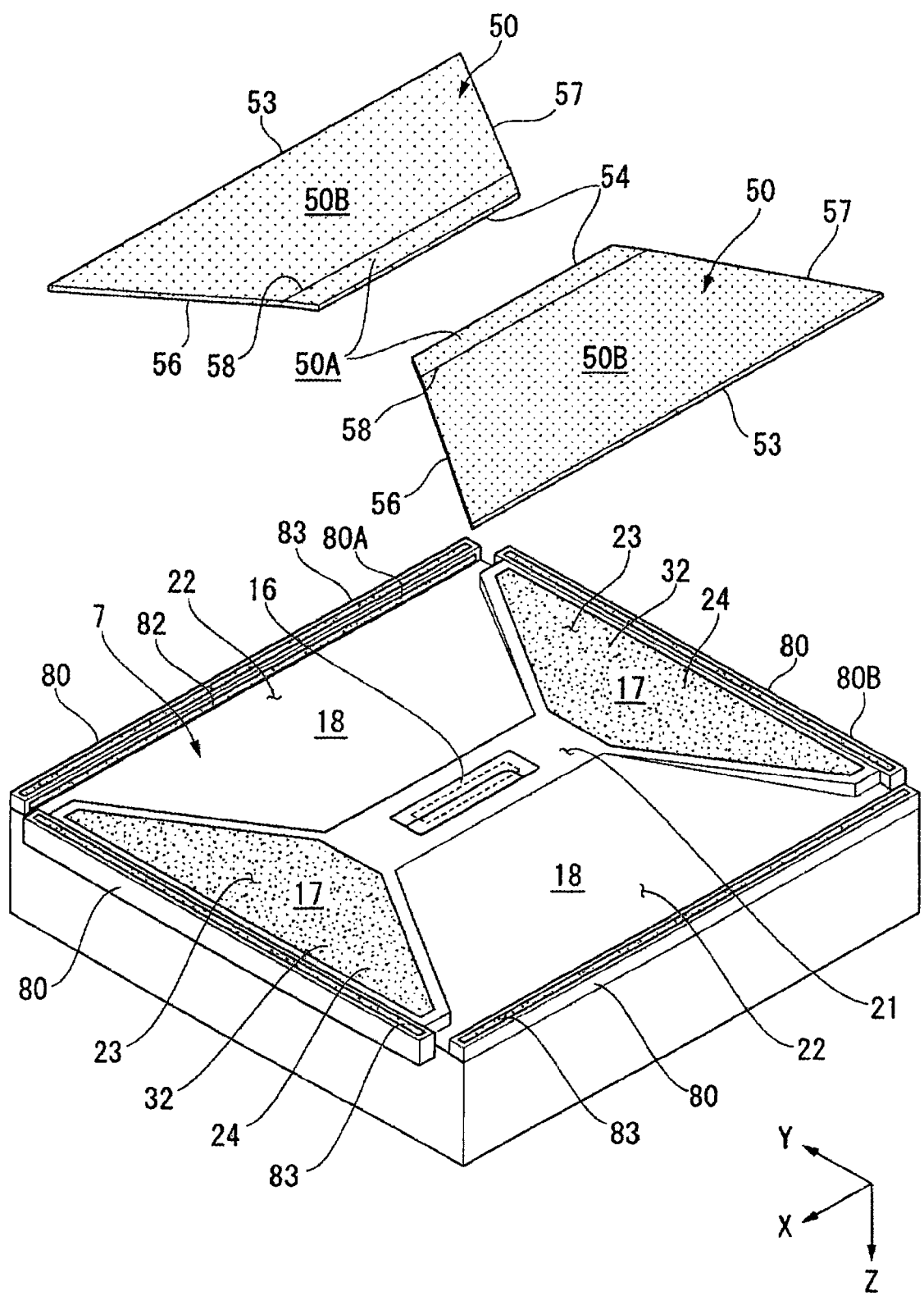
FIG. 3 is an oblique view that shows the liquid immersion member according to the first embodiment, viewed from the lower side.
Figure 4:
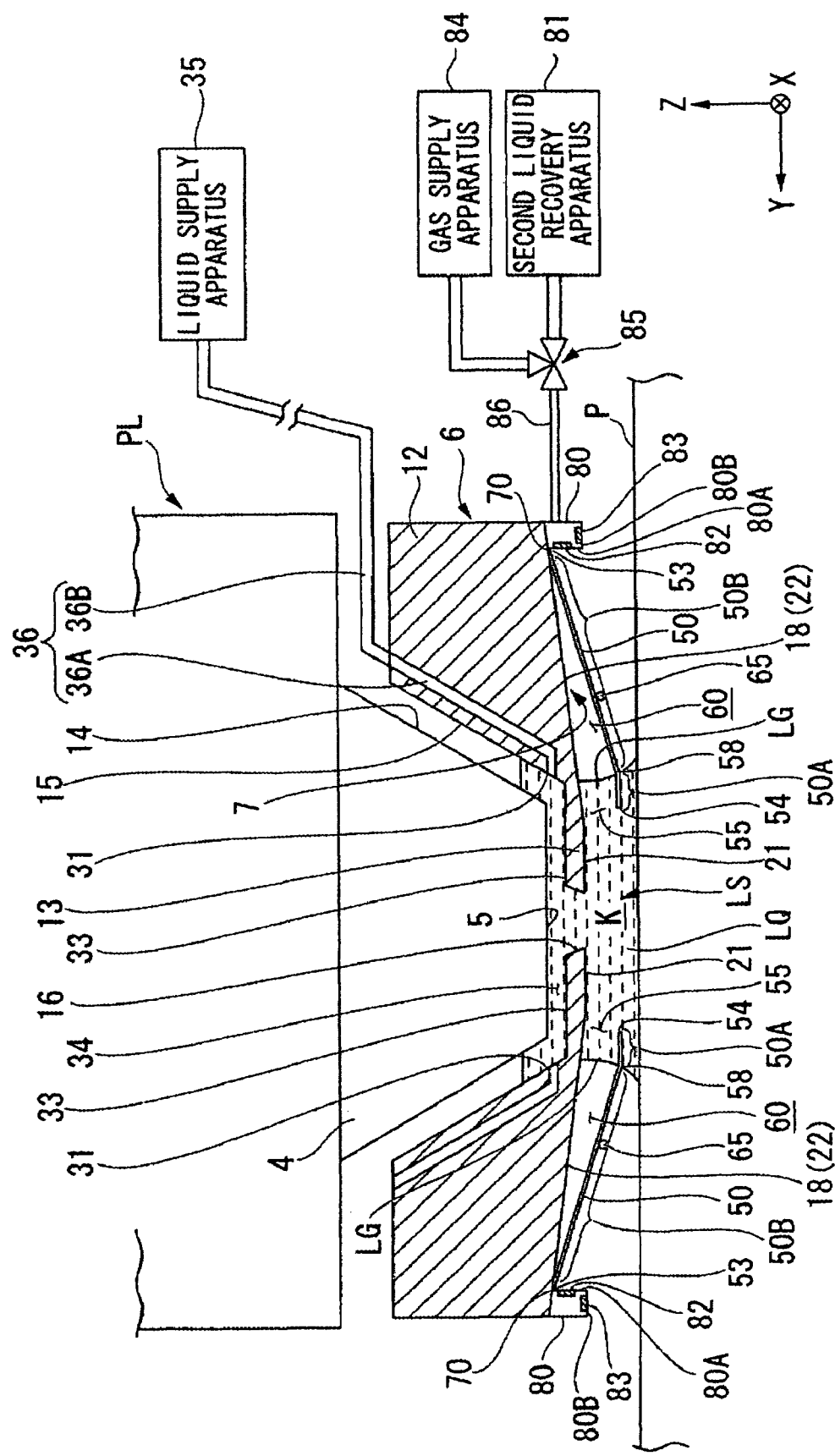
FIG. 4 is a side cross sectional view that is parallel to the YZ plane and shows the vicinity of the liquid immersion member according to the first embodiment.
Figure 5:
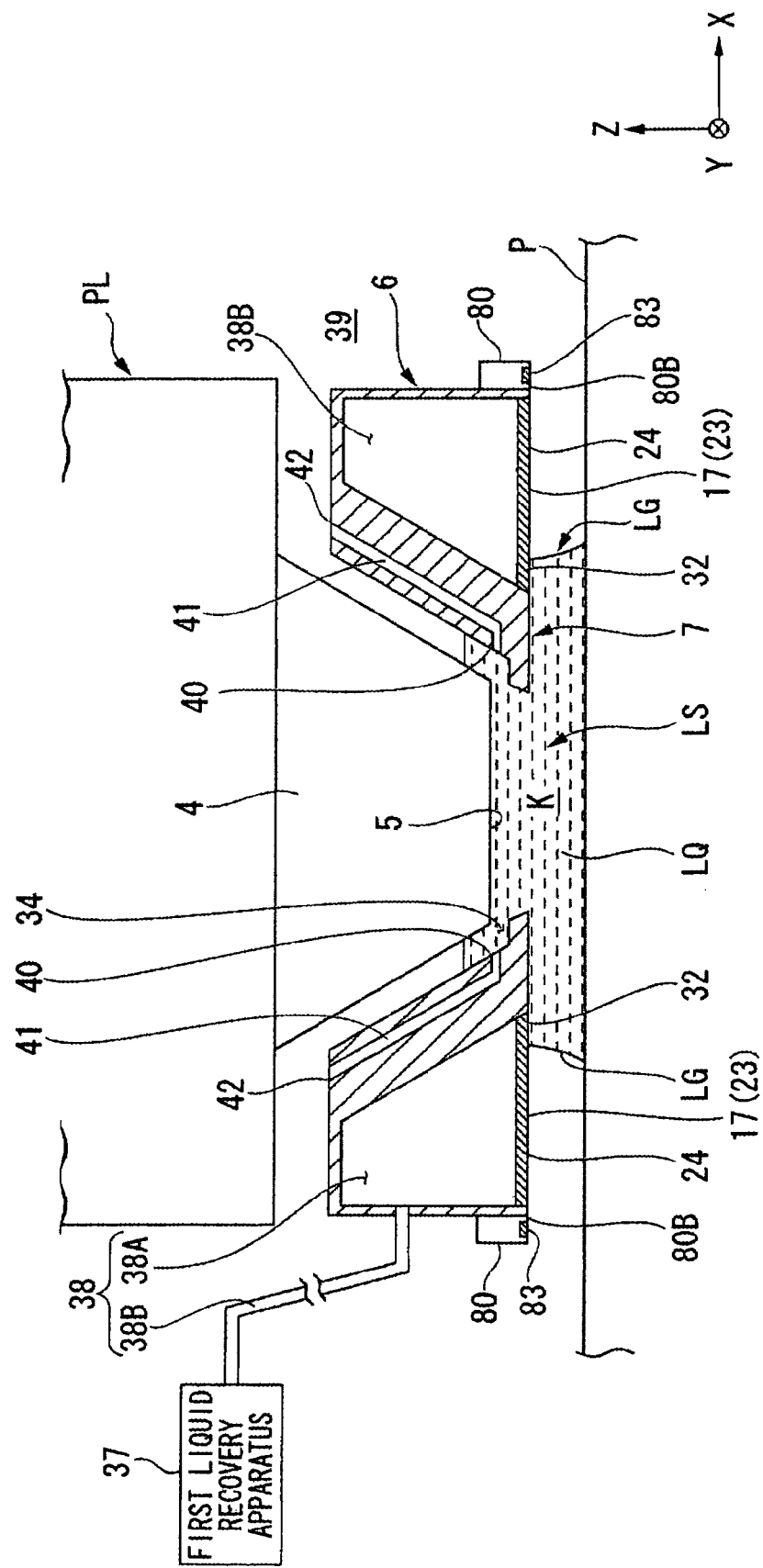
FIG. 5 is a side cross sectional view that is parallel to the XZ plane and shows the vicinity of the liquid immersion member according to the first embodiment.

The following explains the liquid immersion member 6, referencing FIG. 2 through FIG. 5. FIG. 2 is a partial, broken, schematic, oblique view that shows the liquid immersion member 6; FIG. 3 is an oblique view of the liquid immersion member 6, viewed from the lower side (−Z side); FIG. 4 is a side cross sectional view that is parallel to the YZ plane; and FIG. 5 is a side cross sectional view that is parallel to the XZ plane.

Furthermore, the following explains an exemplary case wherein the substrate P is disposed at a position at which it opposes the emergent surface 5 of the last optical element 4 as well as the liquid contact surface 7 of the liquid immersion member 6; however, as discussed above, it is also possible to dispose an object other than the substrate P, such as the substrate stage 2, at a position at which it opposes the emergent surface 5 of the last optical element 4 as well as the liquid contact surface 7 of the liquid immersion member 6. In addition, in the explanation below, the emergent surface 5 of the last optical element 4 is properly called the lower surface 5 of the last optical element 4, and the liquid contact surface 7 of the liquid immersion member 6 is properly called the lower surface 7 of the liquid immersion member 6.

The liquid immersion member 6 is an annular member and is disposed around the optical path of the exposure light EL. In the present embodiment, the liquid immersion member 6 comprises an upper plate part 12, which is disposed around the last optical element 4, and a lower plate part 13, at least part of which is disposed between the lower surface 5 of the last optical element 4 and the front surface of the substrate P in the Z axial directions. In the embodiment, the term of "annular" can include a substantially rectangular shaped annular. Alternatively or also, "annular" can include various shapes such as a substantially rectangular shaped annular, a substantially ring shaped annular, a substantially circular shaped annular, a substantially polygon shaped annular, and the like.

The upper plate part 12 opposes an outer circumferential surface 14 of the last optical element 4 and has an inner circumferential surface 15 that is formed along its outer circumferential surface. The inner circumferential surface 15 of the liquid immersion member 6 is disposed so that it opposes the outer circumferential surface 14 of the last optical element 4 with a prescribed gap interposed therebetween.

The lower plate part 13 has an opening 16 at its center. The exposure light EL that emerges from the lower surface 5 of the last optical element 4 can pass through the opening 16. For example, during an exposure of the substrate P, the exposure light EL that emerges from the lower surface 5 of the last optical element 4 passes through the opening 16 and is radiated to the front surface of the substrate P through the liquid LQ. In the present embodiment, the cross sectional shape of the exposure light EL in the opening 16 is substantially rectangular (slit shaped) with the longitudinal directions in the X axial directions. The opening 16 is formed in a substantially rectangular shape (a slit shape) in the X and Y directions in accordance with the cross sectional shape of the exposure light EL. In addition, the cross sectional shape of the exposure light EL in the opening 16 and the shape of the projection region PR of the projection optical system PL on the substrate P are substantially the same.

The lower surface 7 of the liquid immersion member 6 comprises liquid recovery areas 17, which are capable of recovering the liquid LQ. The liquid immersion member 6 is capable of recovering the liquid LQ on the substrate P, which is disposed at the −Z side of the lower surface 7, from the liquid recovery areas 17. The liquid recovery areas 17 include the front surfaces (the lower surfaces) of porous members (mesh members) 24. At least part of the liquid LQ on the substrate P, which is disposed at the −Z side of the liquid recovery areas 17, is recovered via the porous members 24. The liquid recovery areas 17 are capable of recovering the liquid LQ that contacts them (the front surfaces of the porous members 24).

In addition, the lower surface 7 of the liquid immersion member 6 has liquid "nonrecovery" areas 18, which are not capable of recovering the liquid LQ. Namely, in the present embodiment, the lower surface 7 of the liquid immersion member 6 includes the liquid recovery areas 17 and the liquid nonrecovery areas 18. The lower surface 7, which includes the liquid recovery areas 17 and the liquid nonrecovery areas 18, is disposed so that it opposes the front surface of the substrate P.

In addition, the lower surface 7 of the liquid immersion member 6 has a first surface 21, which is disposed around the optical path of the exposure light EL, second surfaces 22, which are disposed at the outer sides of the first surface 21 with respect to the optical path of the exposure light EL, and third surfaces 23, which are disposed at the outer sides of the first surface 21 with respect to the optical path of the exposure light EL. The second surfaces 22 are disposed at opposite sides of the optical path of the exposure light EL in the Y axial directions. The third surfaces 23 are disposed at opposite sides of the optical path of the exposure light EL in the X axial directions. Namely, one of the second surfaces 22 is provided in one of the Y axial directions (the +Y side) and the other of the second surfaces 22 is provided in the other of the Y axial directions (the −Y side) with respect to the first surface 21. One of the third surfaces 23 is provided in one of the X axial directions (the +X side) and the other of the third surfaces 23 is provided in the other of the X axial directions (the −X side) with respect to the first surface 21.

The first surface 21 is capable of holding the liquid LQ between itself and the front surface of the substrate P. In the present embodiment, the first surface 21 is flat and is substantially parallel to the front surface of the substrate P (the XY plane). In the present embodiment, the external shape of the first surface 21 within the XY plane is rectangular. In the present embodiment, the first surface 21 includes the lower surface of the lower plate part 13. The first surface 21 is disposed around the opening 16. The first surface 21 is not capable of recovering the liquid LQ.

Each of the second surfaces 22 is capable of holding the liquid LQ between itself and the front surface of the substrate P. The second surfaces 22 are disposed at positions at which they are further from the front surface of the substrate P than the first surface 21 is. The second surfaces 22 are inclined in the Y axial directions so that they become gradually spaced apart from the front surface of the substrate P in the directions (the radial directions) that lead away from the optical path of the exposure light EL.

In the embodiment, the second surfaces 22 include the liquid nonrecovery areas 18. Namely, in the present embodiment, the front surfaces (the lower surfaces) of the liquid nonrecovery areas 18 are disposed at positions at which they are further from the front surface of the substrate P than the first surface 21 is, and are inclined in the Y axial directions so that they become gradually spaced apart from the front surface of the substrate P in the directions that lead away from the optical path of the exposure light EL.

In the present embodiment, the −Y side edge of the second surface 22 that is disposed at the +Y side of the optical path of the exposure light EL and the +Y side edge of the first surface 21 are disposed at substantially the same position (height) in the Z axial directions. In addition, the +Y side edge of the second surface 22 that is disposed at the −Y side of the optical path of the exposure light EL and the −Y side edge of the first surface 21 are disposed at substantially the same position (height) in the Z axial directions.

In addition, in the present embodiment, the external shapes of the second surfaces 22 (the liquid nonrecovery areas 18) within the XY plane are trapezoids, wherein the +Y side and −Y side edges of the first surface 21 are the upper sides.

The third surfaces 23 are disposed within the same plane as the first surface 21. Namely, the first surface 21 and the third surfaces 23 are flush and are parallel to the front surface (the XY plane) of the substrate P.

The third surfaces 23 include the liquid recovery areas 17. Namely, in the present embodiment, the liquid recovery areas 17 are disposed within the same plane as the first surface 21 and are substantially parallel to the front surface (the XY plane) of the substrate P.

In addition, in the present embodiment, the external shapes of the third surfaces 23 (the liquid recovery areas 17) within the XY plane are trapezoids, wherein the +X side and the −X side edges of the first surface 21 are the upper sides.

As shown in FIG. 3, in the present embodiment, the liquid recovery areas 17 and the liquid nonrecovery areas 18 are disposed alternately around the optical path of the exposure light EL (around the first surface 21).

The exposure apparatus EX comprises supply ports 31 that supply the liquid LQ and first recovery ports 32 that recover the liquid LQ. In the present embodiment, the supply ports 31 and the first recovery ports 32 are provided to the liquid immersion member 6.

The supply ports 31 are disposed in the vicinity of the optical path space K and are capable of supplying the liquid LQ to the optical path space K. The supply ports 31 supply the liquid LQ in order to form the immersion space LS. The supply ports 31 are capable of supplying the liquid LQ to the space between the front surface of the substrate P on one side and the lower surface 5 of the last optical element 4 and the lower surface 7 of the liquid immersion member 6 on the other side.

In the present embodiment, the liquid immersion member 6 is disposed around the optical path of the exposure light EL and has an upper surface 33 that opposes the lower surface 5 of the last optical element 4 with a prescribed gap interposed therebetween. In the present embodiment, the upper surface 33 includes the upper surface of the lower plate part 13. The upper surface 33 is flat and is substantially parallel to the XY plane. The upper surface 33 is disposed around the opening 16.

The supply ports 31 are disposed in the vicinity of a prescribed space 34 between the lower surface 5 of the last optical element 4 and the upper surface 33. The supply ports 31 are disposed so that they contact the prescribed space 34 and are capable of supplying the liquid LQ thereto. In addition, in the present embodiment, the supply ports 31 are provided at opposite sides of the optical path space K in the Y axial directions (one on each side). In the explanation below, the prescribed space 34 is properly called the interior space 34.

In addition, the exposure apparatus EX comprises a liquid supply apparatus 35. The liquid supply apparatus 35 is capable of feeding the pure, temperature adjusted liquid LQ. The supply ports 31 are connected to the liquid supply apparatus 35 via passageways 36. Each passageway 36 comprises a supply passageway 36A, which is formed inside the liquid immersion member 6, and a passageway 36B, which is formed from a supply pipe that connects the supply passageway 36A and the liquid supply apparatus 35. The liquid LQ that is fed from the liquid supply apparatus 35 is supplied to each of the supply ports 31 through the corresponding passageway 36. The supply ports 31 supply the liquid LQ from the liquid supply apparatus 35 to the optical path space K.

The first recovery ports 32 are capable of recovering the liquid LQ by suctioning it. The porous members 24 are disposed in the first recovery ports 32 and form the liquid recovery areas 17. In the present embodiment, the porous members 24 are plate shaped members.

In addition, the exposure apparatus EX comprises a first liquid recovery apparatus 37, which is capable of recovering the liquid LQ. The first liquid recovery apparatus 37 includes a vacuum system and is capable of recovering the liquid LQ by suctioning it. The first recovery ports 32 (the liquid recovery areas 17) and the first liquid recovery apparatus 37 are connected via passageways 38. Each passageway 38 comprises a recovery passageway 38A, which is formed inside the liquid immersion member 6, and a passageway 38B, which is formed from a recovery pipe that connects the recovery passageway 38A and the first liquid recovery apparatus 37. In the present embodiment, the control apparatus 3 recovers the liquid LQ via the porous members 24 (the liquid recovery areas 17) by driving the first liquid recovery apparatus 37, which includes the vacuum system, so as to create a pressure differential between the upper surfaces and the lower surfaces of the porous members 24. The liquid LQ that is recovered from the liquid recovery areas 17 is recovered by the first liquid recovery apparatus 37 via the passageways 38.

The first recovery ports 32 recover at least part of the liquid LQ on the substrate P during the exposure of the substrate P. The liquid LQ that is recovered via the first recovery ports 32 is fed to the first liquid recovery apparatus 37. The control apparatus 3 is capable of forming the immersion space LS with the liquid LQ between the substrate P on one side and the last optical element 4 and the liquid immersion member 6 on the other side by performing the liquid recovery operation, wherein the first recovery ports 32 (the liquid recovery areas 17) are used, in parallel with the liquid supply operation wherein the supply ports 31 are used. The liquid immersion member 6 forms the immersion space LS so that the optical path of the exposure light EL on the light emergent side of the last optical element 4 is filled with the liquid LQ at least during the exposure of the substrate P.

The porous members 50 are disposed at positions at which they can contact the liquid LQ from the supply ports 31. Namely, the porous members 50 are capable of contacting the liquid LQ of the immersion space LS. Furthermore, FIG. 3 shows a state wherein the liquid immersion member 6 and the porous members 50 are separated.

In the present embodiment, the porous members 50 are plate shaped members. The porous members 50 include meshes. The porous members 50 are lyophilic (hydrophilic) with respect to the liquid LQ (water). For example, the contact angle of the liquid LQ with respect to the surface of each of the porous members 50 can be equal to or less than about 90, 80, 70, 60, 50, 40, 30, 20, 10°, and can more preferably be equal to or less than 20°.

Figure 6A:
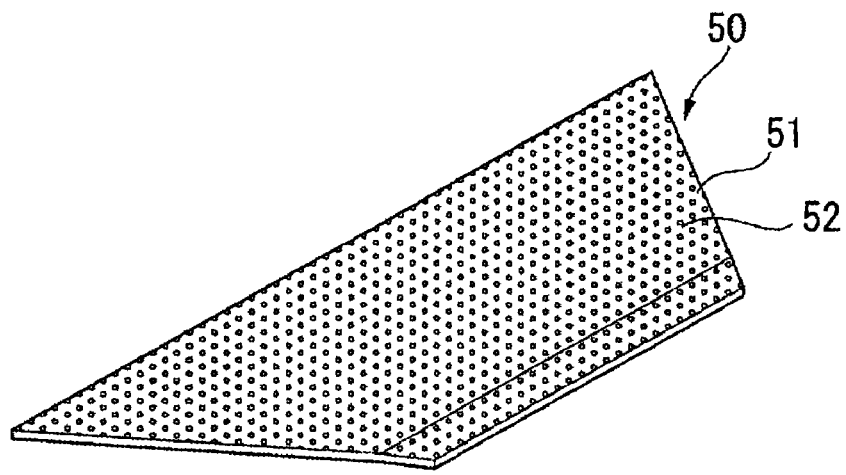
FIG. 6A is an oblique view of the porous member according to the first embodiment.
Figure 6B:
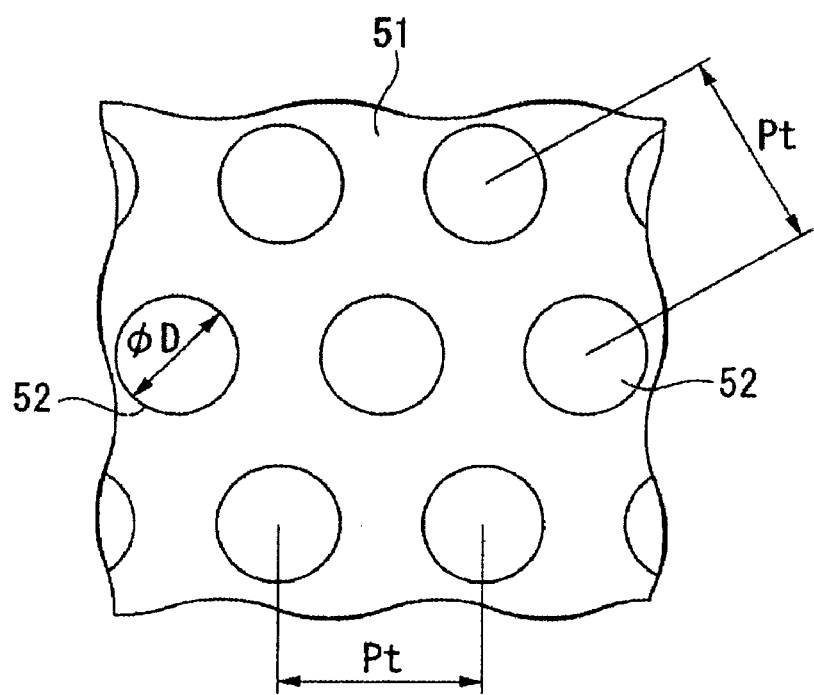
FIG. 6B is an enlarged view of the porous member according to the first embodiment.

FIG. 6A is an oblique view that shows one of the porous members 50, and FIG. 6B is an enlarged view of one of the porous members 50. As shown in FIGS. 6A and 6B, in the present embodiment, the porous member 50 comprises a plate 51, which is formed from a lyophilic material, and a plurality of minute, circular pores 52, which are formed in the plate 51. In the present embodiment, each of the porous members 50 is formed from titanium, which is lyophilic with respect to the liquid LQ. Furthermore, each of the porous members 50 may be formed from stainless steel, which is lyophilic with respect to the liquid LQ. In addition, the pores 52 may be polygonal (e.g., rectangular) in shape.

The porous members 50 are capable of trapping (holding) the liquid LQ. In the explanation below, the porous members 50 are properly called the trapping mesh members 50.

Each of the trapping mesh members 50 can increase the lyophilicity of its surface by capturing the liquid LQ. By bringing the liquid LQ into contact with the trapping mesh members 50, the surfaces of the trapping mesh members 50 form lyophilic surfaces that are more lyophilic with respect to the liquid LQ than the trapping mesh members 50 themselves are.

Figure 7:
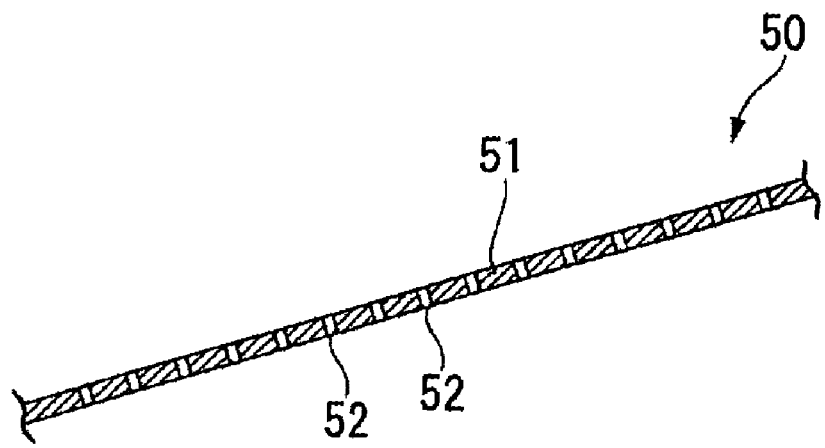
FIG. 7 is a schematic cross sectional view that shows the porous member according to the first embodiment.

FIG. 7 is a schematic, cross sectional view that shows an example of the trapping mesh members 50. If the liquid LQ is brought to the trapping mesh member 50 when it is not wet, then the trapping mesh member 50 captures (holds) that liquid LQ. Namely, the liquid LQ that contacts the trapping mesh member 50 penetrates the pores 52 of the trapping mesh member 50 as a result of capillary action, is held inside the pores 52, and thereby a film of the liquid LQ is formed in each of the pores 52. Thereby, the surfaces of the trapping mesh member 50 are formed by the surfaces of the lyophilic plate 51 and the liquid LQ that is held in the pores 52. Because the surfaces of the trapping mesh member 50 include the surface of the liquid LQ, the surfaces of the trapping mesh member 50 are extremely lyophilic with respect to (have affinity for) the liquid LQ. Furthermore, although the thickness of the plate 51 as well as the diameter, the arrangement, and the like of the pores 52 can be appropriately determined so that the film of the liquid LQ is formed in the pores 52, it is preferable, taking the strength and the like of the plate 51 into consideration, to set a thickness T of the plate 51 to 0.1-0.2 mm, a diameter $\phi D$ of the pores 52 of the plate 51 to 0.1-0.2 mm, a pore-to-pore spacing (pitch) Pt to 0.12-0.30 mm, and an aperture percentage (an aperture ratio) A to 40-60% (refer to FIG. 6B).

Returning to FIG. 2 through FIG. 5, in the present embodiment, each of the trapping mesh members 50 is disposed at the −Z side (the substrate P side) of the liquid nonrecovery areas 18 of the liquid immersion member 6. One surface of each of the trapping mesh members 50 opposes the corresponding liquid nonrecovery area 18 (the second surface 22). The trapping mesh members 50 are disposed between the front surface of the substrate P and the liquid nonrecovery areas 18 (the second surfaces 22). Namely, in each of the figures, the front surface of the substrate P opposes the other surface of each of the trapping mesh members 50.

Two trapping mesh members 50 are provided so that they oppose the two liquid nonrecovery areas 18, respectively. Accordingly, the trapping mesh members 50 are disposed at opposite sides of the optical path of the exposure light EL in the Y axial directions (in the scanning directions of the substrate P).

In the present embodiment, the external shapes of the liquid nonrecovery areas 18 (the second surfaces 22) in the XY plane are substantially identical to the external shapes of the trapping mesh members 50.

In addition, in the present embodiment, prescribed spaces (gaps) 60 are formed between the lower surface 7 of the liquid immersion member 6 and the upper surfaces of the trapping mesh members 50.

The exposure apparatus EX comprises support mechanisms 70, which support the trapping mesh members 50. Two support mechanisms 70 are provided so that they correspond to the two trapping mesh members 50. The support mechanisms 70 support the trapping mesh members 50 so that the upper surfaces of the trapping mesh members 50 and the liquid nonrecovery areas 18 of the liquid immersion member 6 are opposed.

In addition, the support mechanisms 70 support the trapping mesh members 50 so that the spaces 60 are formed between the upper surfaces of the trapping mesh members 50 and the liquid nonrecovery areas 18 of the liquid immersion member 6. In addition, the support mechanisms 70 support the trapping mesh members 50 so that the trapping mesh members 50 and the substrate P do not come into contact.

In the present embodiment, each of the support mechanisms 70 supports one end part 53 of the corresponding trapping mesh member 50. The support mechanisms 70 are disposed at the outer edges of the second surfaces 22. Another end part 54 of each of the trapping mesh members 50 is disposed so that it opposes the optical path of the exposure light EL. In the present embodiment, the one end parts 53 of the trapping mesh members 50, which are supported by the support mechanisms 70, are fixed ends, and the other end parts 54 of the trapping mesh members 50, which are disposed at positions that are near the optical path of the exposure light EL, are free ends.

An opening 55, into which the liquid LQ on the substrate P can flow, is formed between the lower surface 7 of the liquid immersion member 6 and the other end part 54 of each of the trapping mesh members 50. The openings 55 are connected to the spaces 60. The liquid LQ on the substrate P can flow into the spaces 60 through the openings 55. In addition, an opening into which the liquid LQ on the substrate P can flow is formed between the lower surface 7 of the liquid immersion member 6 and an end part 56 (refer to FIG. 3 and the like) at the +X side of each trapping mesh member 50 as well as between the lower surface 7 of the liquid immersion member 6 and an end part 57 (refer to FIG. 3 and the like) at the −X side of each trapping mesh member 50. The liquid LQ on the substrate P can flow into the spaces 60 through the openings 55. Namely, part of the liquid LQ on the substrate P can flow into the spaces 60 through the openings 55 between the lower surface 7 of the liquid immersion member 6 and the end parts of the trapping mesh members 50 without going through the pores 52 of the trapping mesh members 50.

In addition, in the present embodiment, at least part of each of the trapping mesh members 50 is disposed at a position at which it is closer to the front surface of the substrate P than the first surface 21 is. Namely, at least part of each of the trapping mesh members 50 is disposed at the −Z side of the first surface 21. In the present embodiment, the vicinity of the other end part 54 of each of the trapping mesh members 50 is disposed at a position at which it is closer to the front surface of the substrate P than the first surface 21 is. In addition, in the present embodiment, a bent part 58 is formed in the vicinity of the other end part 54 of each of the trapping mesh members 50. In the present embodiment, the trapping mesh members 50 comprise flat parts 50A, which are provided between the other end parts 54 and the bent parts 58 and are substantially parallel to the front surface of the substrate P (the XY plane), and inclined parts 50B, which are provided between the bent parts 58 and the one end parts 53 and are inclined in the Y axial directions so that they become gradually spaced apart from the front surface of the substrate P in the directions that lead away from the optical path of the exposure light EL.

In addition, each of the trapping mesh members 50 is a leaf spring shaped member and is elastically deformable. As discussed above, in the present embodiment, each of the trapping mesh members 50 is a plate shaped member that is made of, for example, titanium, has a thickness of, for example, approximately 0.1 mm, and is elastically deformable.

In addition, as shown in FIG. 4, the exposure apparatus EX of the present embodiment comprises contact preventing members 65, which are disposed between the front surface of the substrate P and the trapping mesh members 50, that prevent the substrate P and the trapping mesh members 50 from coming into contact. The contact preventing members 65 are, for example, wire shaped or rod shape members and are disposed between the substrate P and the trapping mesh members 50 so that they extend in the X axial directions. Prescribed support apparatuses (not shown) support both ends of each of the contact preventing members 65. The contact preventing members 65 are capable of supporting the lower surfaces of the trapping mesh members 50. The contact preventing members 65 can prevent the downward movement of the trapping mesh members 50 by, for example, the self weight of the trapping mesh members 50, the effect of gravity, and the like. Thereby, the contact preventing members 65 can prevent contact between the substrate P and the trapping mesh members 50.

The exposure apparatus EX of the present embodiment comprises second recovery ports 82 and third recovery ports 83, both of which are disposed at the outer sides of the second surfaces 22 with respect to the optical path of the exposure light EL, that are capable of recovering the liquid LQ. The first recovery ports 32 (the liquid recovery areas 17) are disposed at the outer edges of the inner sides of the lower surface 7 with respect to the optical path of the exposure light EL. The second recovery ports 82 and the third recovery ports 83 are disposed at the outer edges of the outer sides of the lower surface 7 with respect to the optical path of the exposure light EL.

The second recovery ports 82 and the third recovery ports 83 are capable of recovering the liquid LQ during the exposure of the substrate P. Thereby, it is possible to prevent, for example, the liquid LQ from leaking from the immersion space LS or remaining on the substrate P.

In the present embodiment, the exposure apparatus EX comprises nozzle members 80, which are disposed on the outer edges of the outer sides of the liquid immersion member 6 (the lower surface 7). The second recovery ports 82 and the third recovery ports 83 are formed in the nozzle members 80. In the present embodiment as shown in, for example, FIG. 2 and FIG. 3, the nozzle members 80 are rod shaped members, and four nozzle members 80 are disposed so that they surround the liquid immersion member 6 (the lower surface 7).

The nozzle members 80 comprise: inner side surfaces 80A, which are disposed at the outer sides of the second surfaces 22 with respect to the optical path of the exposure light EL, that oppose the optical path of the exposure light EL; and lower surfaces 80B, which are disposed at the outer sides of the lower surface 7 with respect to the optical path of the exposure light EL, that oppose the front surface of the substrate P. The lower surfaces 80B of the nozzle members 80 are disposed around the lower surface 7 of the liquid immersion member 6. The lower surfaces 80B of the nozzle members 80 and the first surface 21 of the liquid immersion member 6 are disposed at substantially the same position (height) in the Z axial directions.

The third recovery ports 83 are formed in the lower surfaces 80B of the nozzle members 80. The third recovery ports 83 are disposed around the optical path of the exposure light EL. Specifically, the third recovery ports 83 are disposed around the lower surface 7 of the liquid immersion member 6.

The second recovery ports 82 are disposed in the inner side surfaces 80A of the nozzle members 80. The inner side surfaces 80A of the nozzle members 80 are disposed at opposite sides of the optical path of the exposure light EL in the Y axial directions. The second recovery ports 82 are disposed at opposite sides of the optical path of the exposure light EL in the Y axial directions.

In addition, as shown in FIG. 4, the exposure apparatus EX comprises a second liquid recovery apparatus 81, which is capable of recovering the liquid LQ. The second liquid recovery apparatus 81 includes a vacuum system and is capable of recovering the liquid LQ by suctioning it. The second recovery ports 82 and the third recovery ports 83 are connected to the second liquid recovery apparatus 81 via recovery passageways, which are formed inside the nozzle members 80, and a recovery pipe 86. The control apparatus 3 can recover the liquid LQ via the second recovery ports 82 and the third recovery ports 83 by driving the second liquid recovery apparatus 81, which includes the vacuum system. The liquid LQ that is recovered from at least one of the second recovery ports 82 and the third recovery ports 83 is recovered by the second liquid recovery apparatus 81 via the recovery passageways and the recovery pipe 86.

In addition, the nozzle members 80 of the exposure apparatus EX comprise gas supply ports for supplying a gas to the trapping mesh members 50. In the present embodiment, the second recovery ports 82 also serve as the gas supply ports.

The exposure apparatus EX comprises a gas supply apparatus 84, which supplies the gas to the gas supply ports (the second recovery ports 82). The gas supply apparatus 84 is connected to the recovery pipe 86 via a passageway switching mechanism 85. The control apparatus 3 controls the passageway switching mechanism 85. When the control apparatus 3 controls the passageway switching mechanism 85, the second liquid recovery apparatus 81, and the gas supply apparatus 84 so that the gas that is fed from the gas supply apparatus 84 is blown out from the gas supply ports (second recovery ports) 82, it can stop the liquid LQ recovery operation (suction operation) that is performed by the second liquid recovery apparatus 81. In addition, when the second liquid recovery apparatus 81 performs the liquid LQ recovery operation (suction operation), the control apparatus 3 can stop the supply of the gas from the gas supply apparatus 84 to the gas supply ports (second recovery ports) 82.

In addition, the liquid immersion member 6 comprises exhaust ports 40, which are for establishing communication between the interior space 34 and an exterior space 39. The exhaust ports 40 are disposed in the vicinity of the interior space 34. The exhaust ports 40 are disposed so that they connect to the interior space 34 and are capable of exhausting the gas therefrom. In addition, in the present embodiment, the exhaust ports 40 are provided at opposite sides (one on each side) of the optical path space K in the X axial directions.

The exhaust ports 40 are connected to exhaust passageways 41, which are formed inside the liquid immersion member 6. An opening 42 at the upper end of each of the exhaust passageways 41 is disposed at a position at which it is capable of contacting the gas of the exterior space 39 (the ambient environment) around the liquid immersion member 6 (the immersion space LS). The gas of the exterior space 39 can flow into the openings 42. The openings 42 are disposed at the +Z side of the exhaust ports 40 at positions at which they do not oppose the front surface of the substrate P. The openings 42 are disposed at positions at which they cannot contact the liquid LQ of the immersion space LS, and therefore the liquid LQ of the immersion space LS does not flow into the openings 42.

The gas of the exterior space 39 can flow into the interior space 34 via the exhaust passageways 41, and the gas of the interior space 34 can flow out to the exterior space 39 via the exhaust passageways 41. In the present embodiment, the gas can continuously flow back and forth between the interior space 34 and the exterior space 39 (the atmospheric space), which is outside of the interior space 34, via the exhaust passageways 41, and the interior space 34 is open to the atmosphere via the exhaust passageways 41.

Furthermore, herein, the liquid supply ports 31 are provided at opposite sides (one on each side) of the optical path space K in the Y axial directions, and the exhaust ports 40 are provided at opposite sides (one on each side) of the optical path space K in the X axial directions; however, the liquid supply ports 31 may be provided at opposite sides of the optical path space K in the X axial directions, and the exhaust ports 40 may be provided at opposite sides of the optical path space K in the Y axial directions.

When the substrate P is disposed at a position at which it opposes the lower surface 7 of the liquid immersion member 6, the liquid immersion member 6 can hold the liquid LQ at least between the front surface of the substrate P and the first surface 21. In the present embodiment, at least the first surface 21 of the liquid immersion member 6 is lyophilic with respect to the liquid LQ, and therefore can maintain contact with the liquid LQ of the immersion space LS even if the substrate P is moved in the X and Y directions. The first surface 21 maintains contact with the liquid LQ of the immersion space LS at least during the exposure of the substrate P.

In addition, the second surfaces 22 are capable of contacting the liquid LQ on the substrate P. In the present embodiment, the second surfaces 22 are also lyophilic with respect to the liquid LQ.

Figure 8:
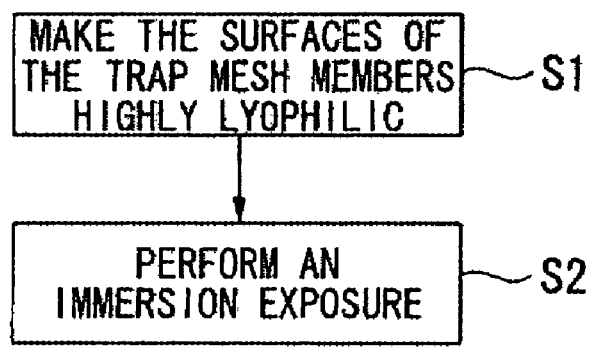
FIG. 8 is a flow chart for explaining one example of an exposing method according to the first embodiment.

The following explains a method of using the exposure apparatus EX that has the abovementioned configuration to perform an immersion exposure on the substrate P. In the present embodiment, as shown by the flow chart diagram in FIG. 8, a process is performed (step S1) that makes the surfaces of the trapping mesh members 50 highly lyophilic by bringing the liquid LQ into contact with the trapping mesh members 50 before the substrate P is exposed, and a process is performed (step S2) wherein an immersion exposure is performed on the substrate P after the highly lyophilic surfaces are formed.

First, to make the surfaces of the trapping mesh members 50 highly lyophilic, the control apparatus 3 feeds the liquid LQ from the liquid supply apparatus 35 and brings liquid LQ from the supply ports 31 into contact with the trapping mesh members 50. When supplying the liquid LQ from the supply ports 31, the control apparatus 3 disposes an object, such as the substrate P, the substrate stage 2, or a dummy substrate, at a position at which it opposes the lower surface 5 of the last optical element 4 and the lower surface 7 of the liquid immersion member 6. Furthermore, the following explains an exemplary case wherein the substrate P is disposed at a position at which it opposes the lower surface 5 of the last optical element 4 and the lower surface 7 of the liquid immersion member 6.

The liquid LQ that is fed from the liquid supply apparatus 35 is supplied to each of the supply ports 31 through the corresponding passageway 36. The supply ports 31 supply the liquid LQ to the interior space 34. The liquid LQ flows through the interior space 34 and into the space between the front surface of the substrate P and the first surface 21 via the opening 16, and is held between the front surface of the substrate P and the first surface 21. In so doing, the immersion space LS is formed so that the interior space 34 and the space between the front surface of the substrate P and the first surface 21 are filled with the liquid LQ, and so that the optical path space K between the front surface of the substrate P and the lower surface 5 of the last optical element 4 is filled with the liquid LQ.

In addition, at least part of the liquid LQ flows into the space between the second surfaces 22 and the front surface of the substrate P and the space between the third surfaces 23 and the front surface of the substrate P. The liquid LQ that is supplied from the supply ports 31 to the space between the lower surface 7 of the liquid immersion member 6 and the front surface of the substrate P is brought to the trapping mesh members 50.

The liquid LQ from the supply ports 31 is brought to the trapping mesh members 50, and contacts them, which fills the plurality of pores 52 of the trapping mesh members 50 with the liquid LQ and thereby makes the surfaces of the trapping mesh members 50 highly lyophilic, as was explained referencing FIG. 7 and the like.

Figure 9A:
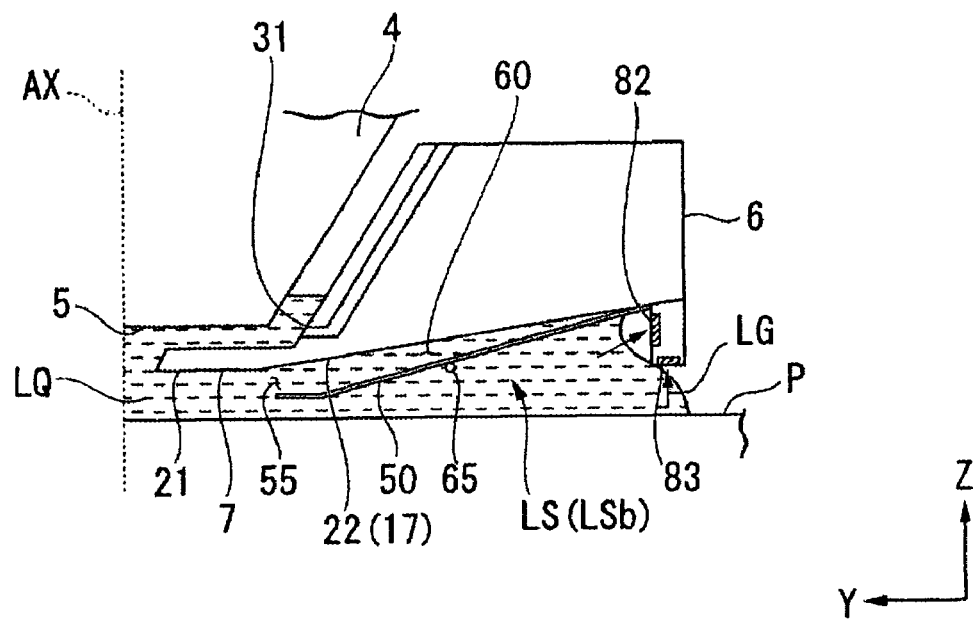
FIG. 9A is a schematic drawing for explaining the process of making the surfaces of the porous member lyophilic.
Figure 9B:
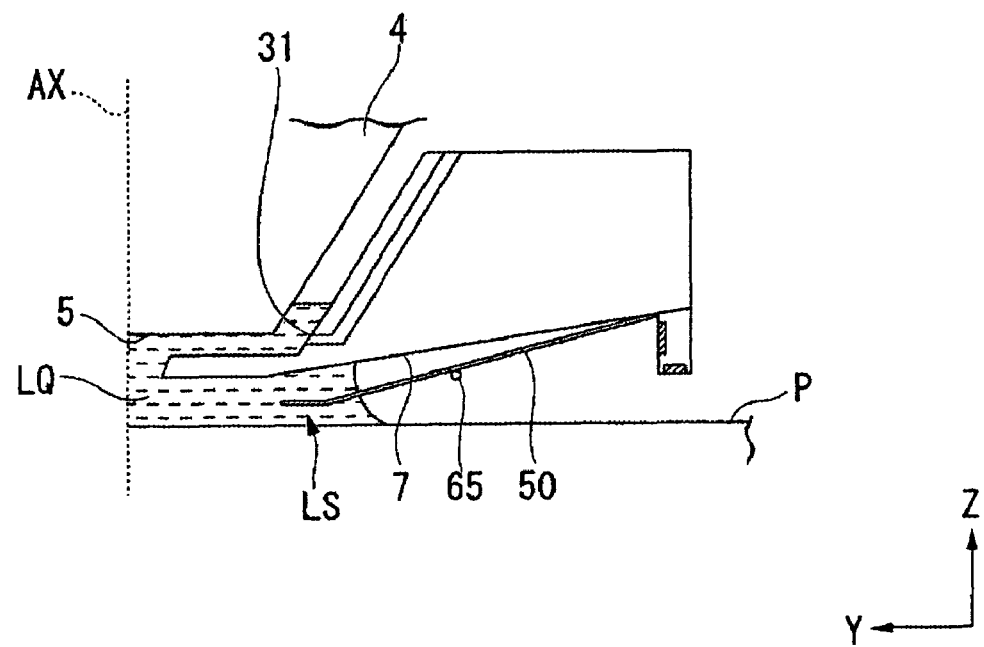
FIG. 9B is a schematic drawing for explaining the process of making the surfaces of the porous member lyophilic.

FIG. 9A and FIG. 9B are schematic drawings that show the operation of the exposure apparatus EX when the surfaces of one of the trapping mesh members 50 are made highly lyophilic. As shown in FIG. 9A, supplying the liquid LQ from the supply port 31 forms the immersion space LS between the front surface of the substrate P on one side and the lower surface 5 of the last optical element 4 and the lower surface 7 of the liquid immersion member 6 on the other side. The liquid LQ that is supplied from the supply port 31 contacts the lower surface of the trapping mesh member 50, which opposes the front surface of the substrate P, and flows into the space 60 between the lower surface 7 of the liquid immersion member 6 and the trapping mesh member 50 via the opening 55 and the like. At least part of the space 60 is filled with the liquid LQ that is supplied from the supply port 31. The liquid LQ that flows into the space 60 contacts the lower surface 7 (the second surface 22) of the liquid immersion member 6 and contacts the upper surface of the trapping mesh member 50, which opposes the lower surface 7 (the second surface 22) of the liquid immersion member 6. In addition, the liquid LQ that is supplied from the supply port 31 also contacts the third surfaces 23 (the liquid nonrecovery areas 18) of the liquid immersion member 6.

In the present embodiment, at least part of each of the trapping mesh members 50 is disposed at a position at which it is closer to the front surface of the substrate P than the first surface 21 is, and therefore the liquid LQ that is supplied from the supply ports 31 is smoothly brought to the trapping mesh members 50; thereby, the liquid LQ can smoothly contact the trapping mesh members 50.

In the present embodiment, when the surfaces of the trapping mesh members 50 are made highly lyophilic, the control apparatus 3 stops the liquid recovery operation wherein the first recovery ports 32 (the liquid recovery areas 17) are used, and performs the liquid recovery operation wherein the second recovery ports 82 and the third recovery ports 83 are used. Namely, in order to bring the liquid LQ from the supply ports 31 into contact with the trapping mesh members 50, the control apparatus 3 performs the liquid recovery operation, wherein the second recovery ports 82 and the third recovery ports 83 are used, in parallel with the liquid supply operation, wherein the supply ports 31 are used, by operating the liquid supply apparatus 35 and the second liquid recovery apparatus 81 in a state wherein the operation of the first liquid recovery apparatus 37 is stopped. In so doing, as shown in FIG. 9A, a large immersion space LSb can be formed, and the interface LG of the immersion space LSb can be disposed in the vicinity of the one end part 53 of the trapping mesh member 50. Thereby, the liquid LQ can contact substantially the entirety of the surfaces of the trapping mesh member 50, and thereby substantially all of the pores 52 of the trapping mesh member 50 can be filled with the liquid LQ. Thereby, substantially the entirety of the surfaces of the trapping mesh member 50 can be made lyophilic.

After the surfaces of the trapping mesh members 50 are made highly lyophilic, the control apparatus 3 starts the liquid recovery operation wherein the first recovery ports 32 (the liquid recovery areas 17) are used. Thereby, as shown in FIG. 9B, the immersion space LS is formed with an optimal size for exposing the substrate P. The control apparatus 3 maintains the immersion space LS in a desired state by performing the liquid recovery operation, wherein the first recovery ports 32 are used, in parallel with the performance of the liquid supply operation wherein the supply ports 31 are used.

Furthermore, the control apparatus 3 starts the immersion exposure of the substrate. The control apparatus 3 disposes the substrate P at the −Z side of the lower surface 7 of the liquid immersion member 6, and forms the immersion space LS between the front surface of the substrate P on one side and the lower surface 5 of the last optical element 4 and the lower surface 7 of the liquid immersion member 6 on the other side. The control apparatus 3 exposes the substrate P while supplying the liquid LQ from the supply ports 31 and recovering the liquid LQ via the first recovery ports 32 (the liquid recovery areas 17), which are disposed at the inner sides of the outer edges of the lower surface 7 with respect to the exposure light EL. The trapping mesh members 50, which are positioned between the lower surface 7 of the liquid immersion member 6 and the front surface of the substrate P, satisfactorily hold at least part of the liquid LQ that is supplied from the supply ports 31 between the lower surface 7 of the liquid immersion member 6 and the front surface of the substrate P. In addition, at least part of the liquid LQ that contacts the liquid recovery areas 17 is suctioned through the porous members 24, which form the liquid recovery areas 17. The control apparatus 3 performs the liquid recovery operation in parallel with the liquid supply operation, and therefore can continuously and locally form the immersion space LS on the substrate P with the liquid LQ that has desired conditions (e.g., temperature and cleanliness level).

As discussed above, the exposure apparatus EX of the present embodiment is a scanning type exposure apparatus. The control apparatus 3 radiates the exposure light EL to the substrate P through the projection optical system PL and the liquid LQ on the substrate P while the front surface of the substrate P moves in one of the Y axial directions with respect to the optical path of the exposure light EL and the immersion space LS in a state wherein the immersion space LS is formed by holding the liquid LQ between the front surface of the substrate P on one side and the lower surface 5 of the last optical element 4 and the lower surface 7 of the liquid immersion member 6 on the other side. Thereby, the image of the pattern of the mask M is projected onto the substrate P, which is thereby exposed with the exposure light EL.

In addition, in order to start the exposure of a second shot region after the exposure of, for example, a first shot region on the substrate P is complete, the control apparatus 3 performs an operation wherein the front surface of the substrate P is moved in one of the X axial directions (or a direction that is inclined with respect to the X axial directions within the XY plane) in a state wherein the immersion space LS is formed.

In the present embodiment, the trapping mesh members 50, which have highly lyophilic surfaces, are disposed between the lower surface 7 of the liquid immersion member 6 and the front surface of the substrate P, and therefore the liquid LQ that is between the lower surface 7 of the liquid immersion member 6 and the front surface of the substrate P is prevented from leaking to the outer side of the space between the lower surface 7 of the liquid immersion member 6 and the front surface of the substrate P even if the front surface of the substrate P is moved at high speed in the X and Y directions (particularly, the Y axial directions) with respect to the immersion space LS. In addition, the liquid LQ (a film, a drop, or the like of the liquid LQ) is prevented from remaining on the front surface of the substrate P. Thus, the provision of the trapping mesh members 50 between the lower surface 7 of the liquid immersion member 6 and the front surface of the substrate P is in accordance with the inventors' findings as described below.

Figure 10:
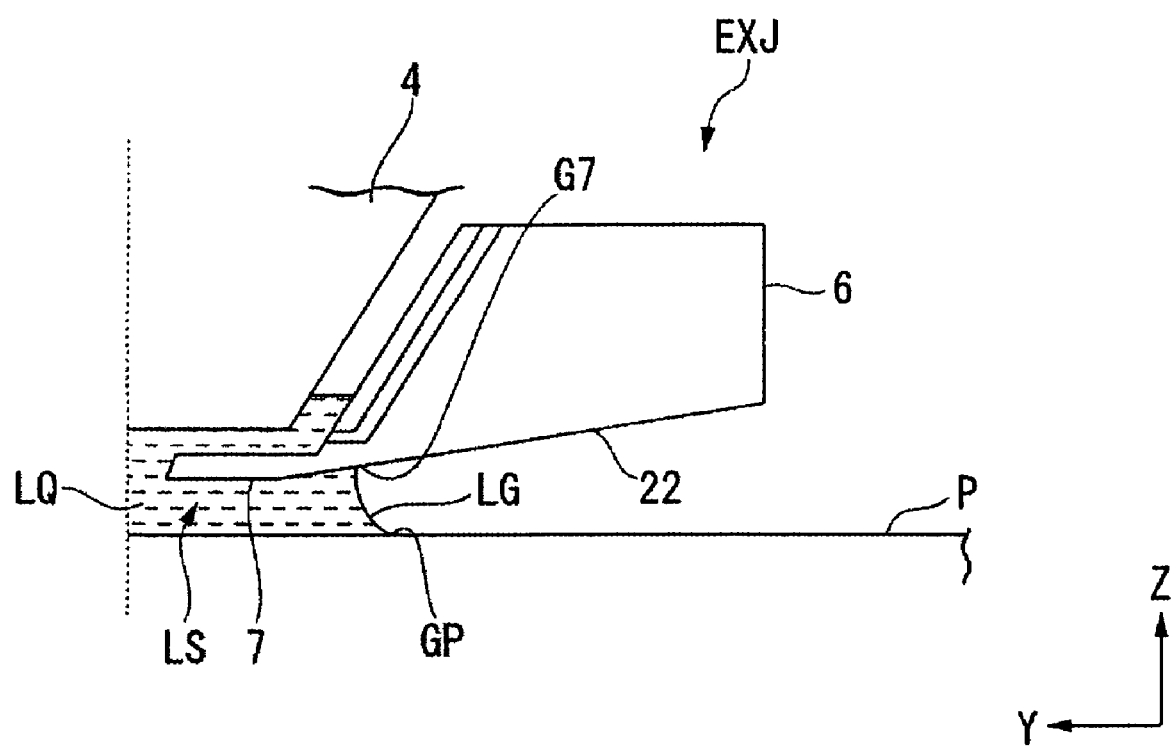
FIG. 10 is a schematic diagram for explaining one example of the operation of the exposure apparatus according to a comparative example.

FIG. 10 is a schematic drawing that shows part of an exposure apparatus EXJ according to a comparative example. Trapping mesh members are not provided to the exposure apparatus EXJ shown in FIG. 10, and the lower surface 7 (the second surface 22) of the liquid immersion member 6 directly opposes the front surface of the substrate P. FIG. 10 is a view that shows the state wherein the immersion space LS is formed between the liquid immersion member 6 and the substrate P, which is in the state wherein it is stationary with respect to the liquid immersion member 6.

Starting from the state shown in FIG. 10, if the substrate P is moved in one direction (herein, the −Y direction) within the XY plane with respect to the immersion space LS (the liquid immersion member 6), then a position G7 at which the interface LG of the liquid LQ contacts the lower surface 7 of the liquid immersion member 6 moves in the movement direction (the −Y direction) of the substrate P, and a position GP at which the interface LG of the liquid LQ contacts the front surface of the substrate P moves in the movement direction (the −Y direction) of the substrate P.

If the substrate P is moved at high speed with respect to the immersion space LS, then there is a possibility that the liquid LQ that contacts the lower surface 7 of the liquid immersion member 6 will separate (detach) from part of the lower surface 7 of the liquid immersion member 6 and that the liquid LQ between the substrate P and the lower surface 7 of the liquid immersion member 6 will form a thin film on the substrate P. There is a possibility that the liquid LQ that forms a thin film on the substrate P will leak to the outer side of the lower surface 7 with respect to the optical path of the exposure light EL. Specifically, there are cases wherein the liquid LQ leaks to the outer side of the space between the liquid immersion member 6 and the substrate P. In addition, there is a possibility that a tip part of the film of the liquid LQ will become isolated on the substrate P, form a drop, and remain on the substrate P, thereby leading to pattern defects and the like.

The inventors found that if an amount of movement L of the position GP of the interface LG of the liquid LQ in the −Y direction is greater than an amount of movement H of the position G7 of the interface LG of the liquid LQ in the −Y direction, then a phenomenon tends to occur wherein the liquid LQ forms a thin film on the substrate P as discussed above. In addition, the inventors found that as the movement speed of the substrate P increases and the distance of travel in one direction (herein, the −Y direction) of the substrate P increases, a difference Δ between the amount of movement H of the position G7 and the amount of movement L of the position GP increases.

The inventors conducted research and found that it is possible to prevent the phenomenon, wherein the liquid LQ forms a thin film on the substrate P, from occurring by reducing the difference Δ between the amount of movement H of the position G7 and the amount of movement L of the position GP. Furthermore, the inventors found that sufficiently increasing the lyophilicity of the surfaces (the lower surfaces) of the members that oppose the substrate P makes it possible to reduce the difference Δ and to prevent the phenomenon, wherein the liquid LQ forms a thin film on the substrate P, from occurring.

Furthermore, in the present embodiment, the trapping mesh members 50 are provided between the front surface of the substrate P and the lower surface 7 of the liquid immersion member 6 so that it is possible to prevent the liquid LQ from forming a thin film even if the substrate P is moved, and to fill the optical path space K with the liquid LQ satisfactorily.

Figure 11:
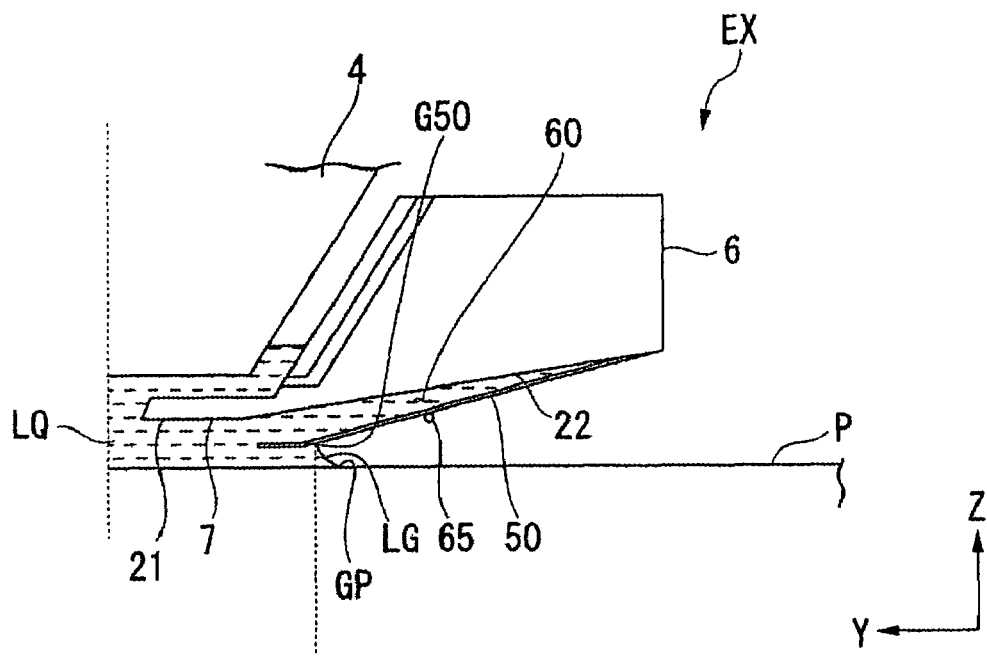
FIG. 11 is a schematic diagram for explaining one example of the operation of the exposure apparatus according to the first embodiment.
Figure 11:
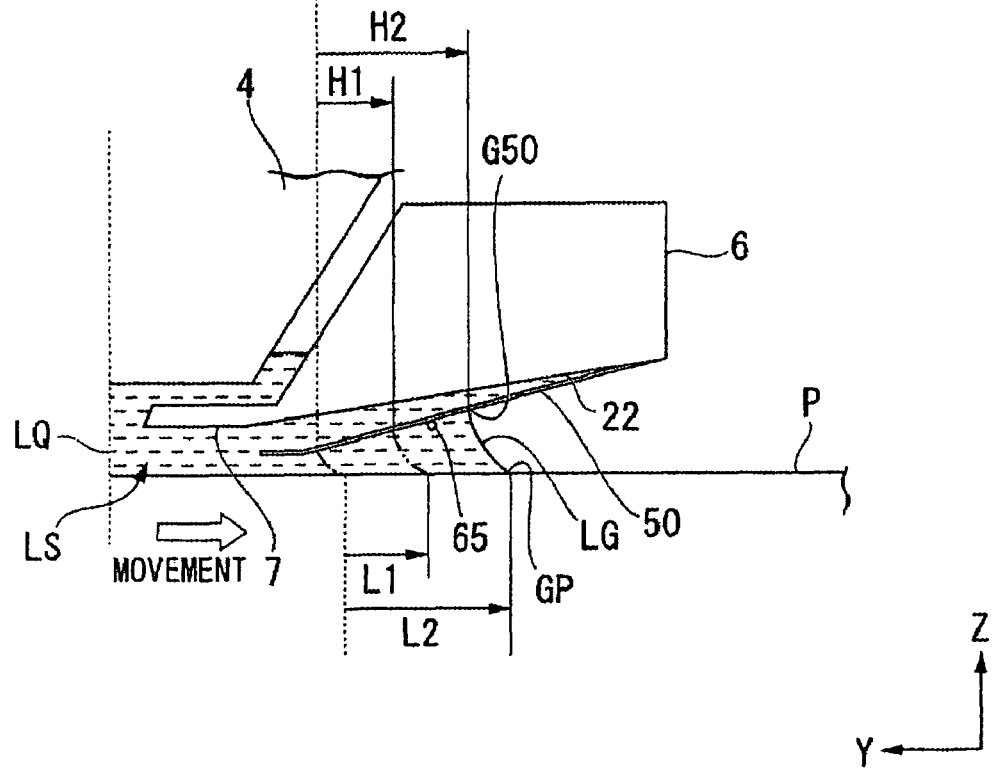

FIG. 11 is a schematic drawing that shows the exposure apparatus EX according to the present embodiment. Part (A) of FIG. 11 shows the state wherein one of the trapping mesh members 50 is used to form the immersion space LS by holding the liquid LQ between the lower surface 7 of the liquid immersion member 6 and the substrate P, which is in the state wherein it is stationary with respect to the liquid immersion member 6. In part (A) of FIG. 11, the liquid LQ contacts the first surface 21. The space 60 where the capillary phenomenon occurs is formed between the lower surface 7 of the liquid immersion member 6 and the trapping mesh member 50, and thereby part of the liquid LQ is held in part of the space 60. In addition, the liquid LQ contacts the second surface 22 as well as the trapping mesh member 50. The interface LG contacts the trapping mesh member 50. In addition, in the state shown in part (A) of FIG. 11, the process described in the abovementioned step S1 has already been performed, and the surfaces of the trapping mesh member 50 are highly lyophilic.

Because the highly lyophilic surfaces are formed on the trapping mesh member 50, the interface LG of the liquid LQ can move smoothly along those highly lyophilic surfaces. Accordingly, if the substrate P is moved in the −Y direction, a position G50 at which the interface LG of the liquid LQ contacts one of the lyophilic surfaces of the trapping mesh member 50 can move smoothly in the −Y direction.

For example, as shown in part (B) of FIG. 11, a difference Δ1 between an amount of movement H1 of the position G50 and an amount of movement L1 of the position GP when the substrate P is moved at a first speed V1 in the −Y direction is small, thereby preventing the phenomenon, wherein the liquid LQ forms a thin film on the substrate P, from occurring. In addition, in the present embodiment, it is also possible to reduce a difference Δ2 between an amount of movement H2 of the position G50 and an amount of movement L2 of the position GP when the substrate P is moved at a second speed V2, which is faster than the first speed V1, in the −Y direction. Accordingly, even if the substrate P is moved at high speed, it is possible to prevent, for example, the liquid LQ from taking on the shape of a film or a drop.

In the present embodiment, at least during the exposure of the substrate P, the liquid recovery operation, wherein the first recovery ports 32 (the liquid recovery areas 17) are used, is performed in parallel with the performance of the liquid supply operation wherein the supply ports 31 are used. Namely, pure (new) liquid LQ can contact the trapping mesh members 50. Accordingly, the interiors of the pores 52 of the trapping mesh members 50 can be filled with the new liquid LQ.

In addition, in the present embodiment, the control apparatus 3 continues to perform the recovery operation using the second liquid recovery apparatus 81 at least during the exposure of the substrate P. Accordingly, even in a case wherein the liquid LQ leaks out from between the lower surface 7 of the liquid immersion member 6 and the front surface of the substrate P, it can be recovered using at least one of the second recovery ports 82 and the third recovery ports 83.

In the present embodiment, all of the liquid LQ of the immersion space LS is recovered with a prescribed timing at a time at which the substrate P is not undergoing an exposure, e.g., during a maintenance process. After all of the liquid LQ of the immersion space LS is recovered, the control apparatus 3 supplies the gas from the gas supply ports 82 to the trapping mesh members 50 via the gas supply ports (second recovery ports) 82.

Figure 12:
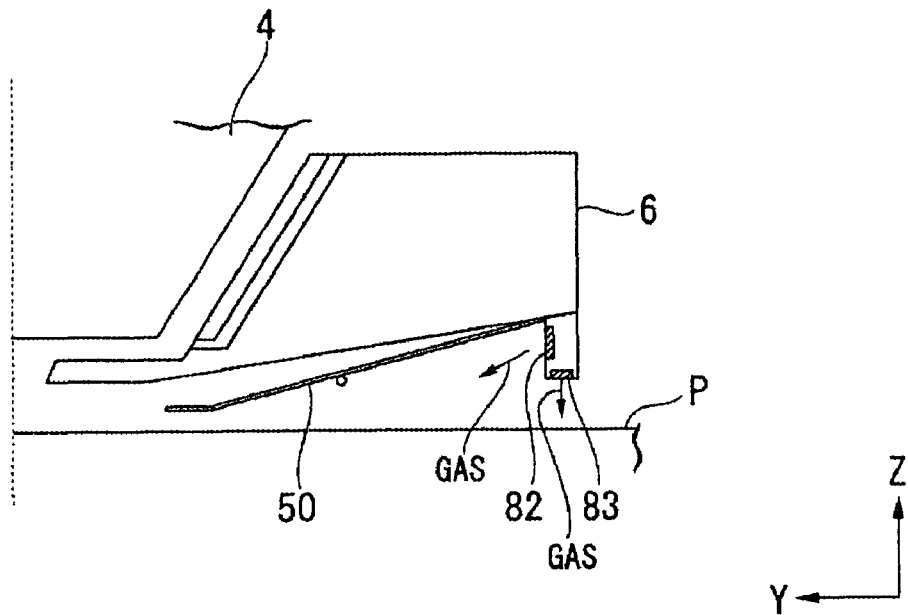
FIG. 12 is a schematic diagram for explaining one example of the operation of the exposure apparatus according to the first embodiment.

FIG. 12 is a schematic drawing that shows the state wherein the gas is supplied from one of the gas supply ports 82. The control apparatus 3 supplies the gas to the trapping mesh member 50 by controlling the passageway switching mechanism 85, the second liquid recovery apparatus 81, and the gas supply apparatus 84 when the substrate P is not undergoing an exposure so as to blow the gas out from the gas supply port 82. Thereby, the trapping mesh member 50 can be dried. Accordingly, it is possible to prevent the trapping mesh member 50 from being left wet. In addition, as shown in FIG. 12, the gas may be blown out not only from the second recovery port 82, which faces the trapping mesh member 50, but also from the third recovery port 83, which faces the front surface of the substrate P (the upper surface 2T of the substrate stage 2). The trapping mesh member 50 can be dried by blowing the gas out from the third recovery port 83 and generating a flow of the gas (a gas current) in the vicinity of the trapping mesh member 50. In addition, the gas that is blown out from the third recovery port 83 can also dry objects that are capable of opposing the last optical element 4 and the liquid immersion member 6 such as the upper surface 2T of the substrate stage 2.

As explained above, in the present embodiment, the trapping mesh members 50 are disposed at the lower surface 7 side of the liquid immersion member 6, which makes it possible to prevent the liquid LQ from leaking or remaining behind and thereby causing exposure failures. In addition, the travel speed of the substrate P can be increased while preventing exposure failures from occurring. Accordingly, satisfactory devices can be fabricated with good productivity.

Figure 13:
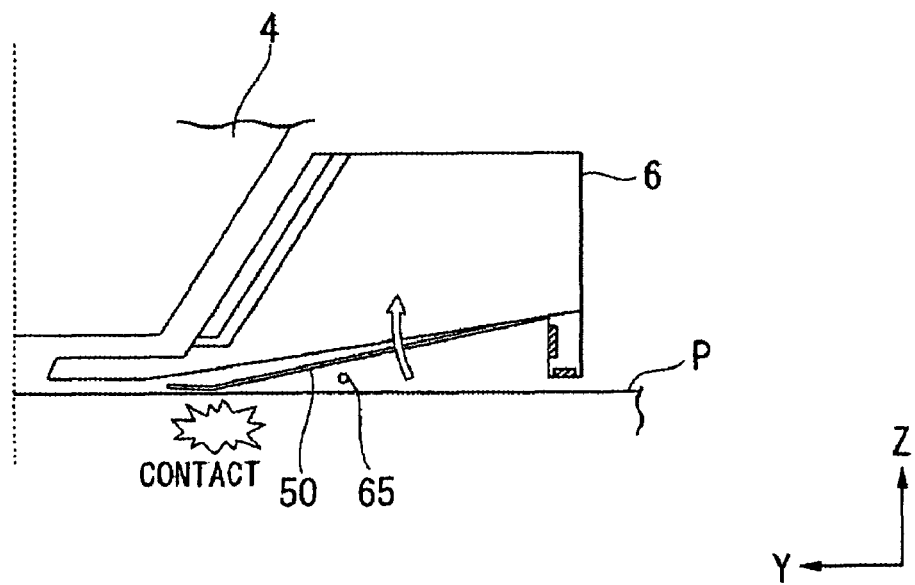
FIG. 13 is a schematic diagram for explaining one example of the operation of the exposure apparatus according to the first embodiment.

As discussed above, the trapping mesh members 50 are leaf spring shaped members and are elastically deformable; therefore, even if, as shown in FIG. 13 for example, one of the trapping mesh members 50 contacts the substrate P, the substrate stage 2, or the like, it is possible to prevent the substrate P, the substrate stage 2, or the like from being affected. In addition, even if the trapping mesh member 50 contacts the substrate P, the substrate stage 2, or the like, it is possible to prevent vibrations from being generated by the elastically deformation of the trapping mesh member 50. Accordingly, it is also possible to prevent the liquid immersion member 6, the projection optical system PL, or the like from being affected. Furthermore, the trapping mesh members 50 do not have to deform elastically.

Figure 14:
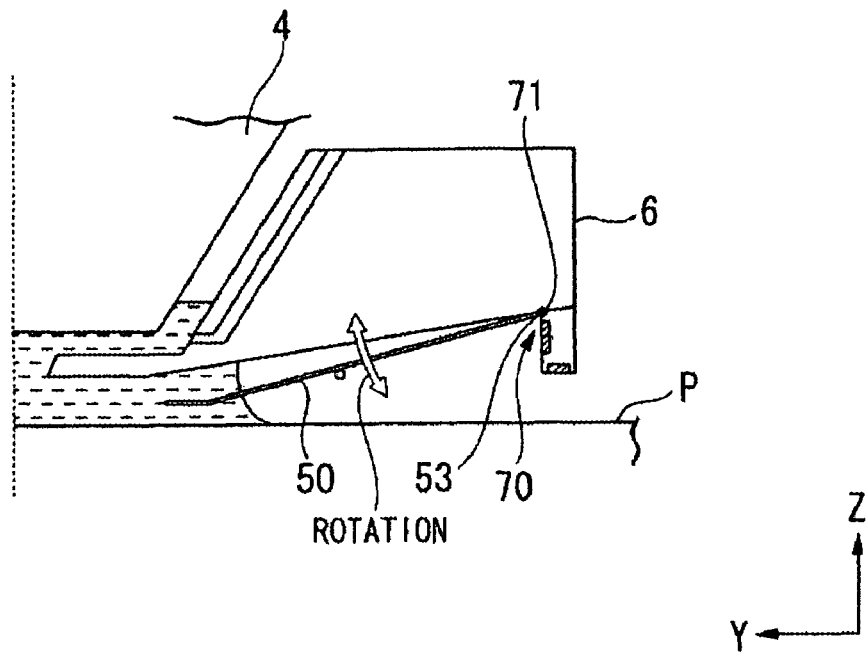
FIG. 14 is a schematic diagram for explaining another example of the operation of the exposure apparatus according to the first embodiment.

In addition, as shown in FIG. 14, the exposure apparatus EX can also comprise a cushioning mechanism 71 that absorbs forces that are applied to the trapping mesh member 50. In the present embodiment, the cushioning mechanism 71 is provided to each of the support mechanisms 70. Each of the cushioning mechanisms 71 comprises a rotary mechanism, which supports the one end part 53 of the corresponding trapping mesh member 50 so that it can rotate in the ΘX directions. Even if the trapping mesh members 50 contact the substrate P, the substrate stage 2, or the like, it is possible to prevent the substrate P, the substrate stage 2, or the like from being afflicted because the trapping mesh members 50 rotate (move) via the cushioning mechanisms 71. In addition, even if the trapping mesh members 50 contact the substrate P, the substrate stage 2, or the like, it is possible to prevent vibrations from being generated because the trapping mesh members 50 rotate (move). Accordingly, it is possible to prevent the liquid immersion member 6, the projection optical system PL, or the like from being affected. Alternatively, the exposure apparatus EX may not comprise the cushioning mechanism 71.

Furthermore, in the present embodiment discussed above, members wherein the multiple, circular pores 52 are formed in the plates 51 are used as the trapping mesh members (porous members) 50, but the trapping mesh members (porous members) 50 are not limited thereto and may be, for example, sintered members (e.g., made of sintered metal) or foam members (e.g., made of metal foam) wherein multiple pores are formed—as long as the members form a film of the liquid LQ such that it opposes the front surface of the substrate P. Even in this case, it is possible to form multiple pores so that the film of the liquid LQ is formed over 40-60% of the front surfaces of the porous members, each of which opposes the front surface of the substrate P.

Figure 15:
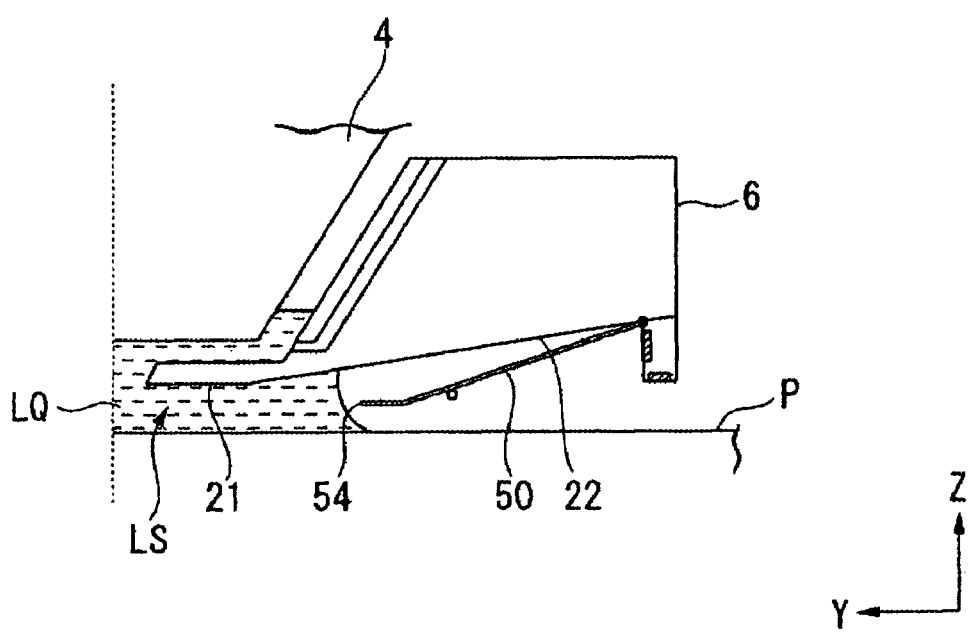
FIG. 15 is a schematic diagram for explaining another example of the operation of the exposure apparatus according to the first embodiment.

Furthermore, the present embodiment discussed above explained an exemplary case wherein the external shapes of the second surfaces 22 and the external shapes of the trapping mesh members 50 are substantially equivalent, but they may be different. For example, as shown in FIG. 15, the external shape of the trapping mesh member 50 may be smaller than the external shape of the second surface 22. In the example shown in FIG. 15, the external shape of the trapping mesh member 50 is smaller than that of the second surface 22. In the example shown in FIG. 15, the other end part 54 of the trapping mesh member 50 is disposed at a position at which it does not contact the liquid LQ of the immersion space LS in the state wherein the substrate P is substantially stationary with respect to the liquid immersion member 6.

Furthermore, part of the trapping mesh member 50 is provided so that it is closer to the substrate P than the first surface 21 is, but the first surface 21 may be closer to the substrate P than the entirety of the trapping mesh members 50 is.

In addition, the trapping mesh members 50 and the second surfaces 22 may be disposed so that they are substantially parallel. In addition, the spaces 60 do not have to be provided as long as the pores 52 of the trapping mesh members 50 can be filled with the liquid LQ.

In addition, the trapping mesh members 50 may be disposed so that they oppose at least part of the first surface 21.

Second Embodiment

The following explains a second embodiment. In the explanation below, constituent parts that are identical or equivalent to those in the embodiment discussed above are assigned identical symbols, and the explanations thereof are therefore abbreviated or omitted.

Figure 16:
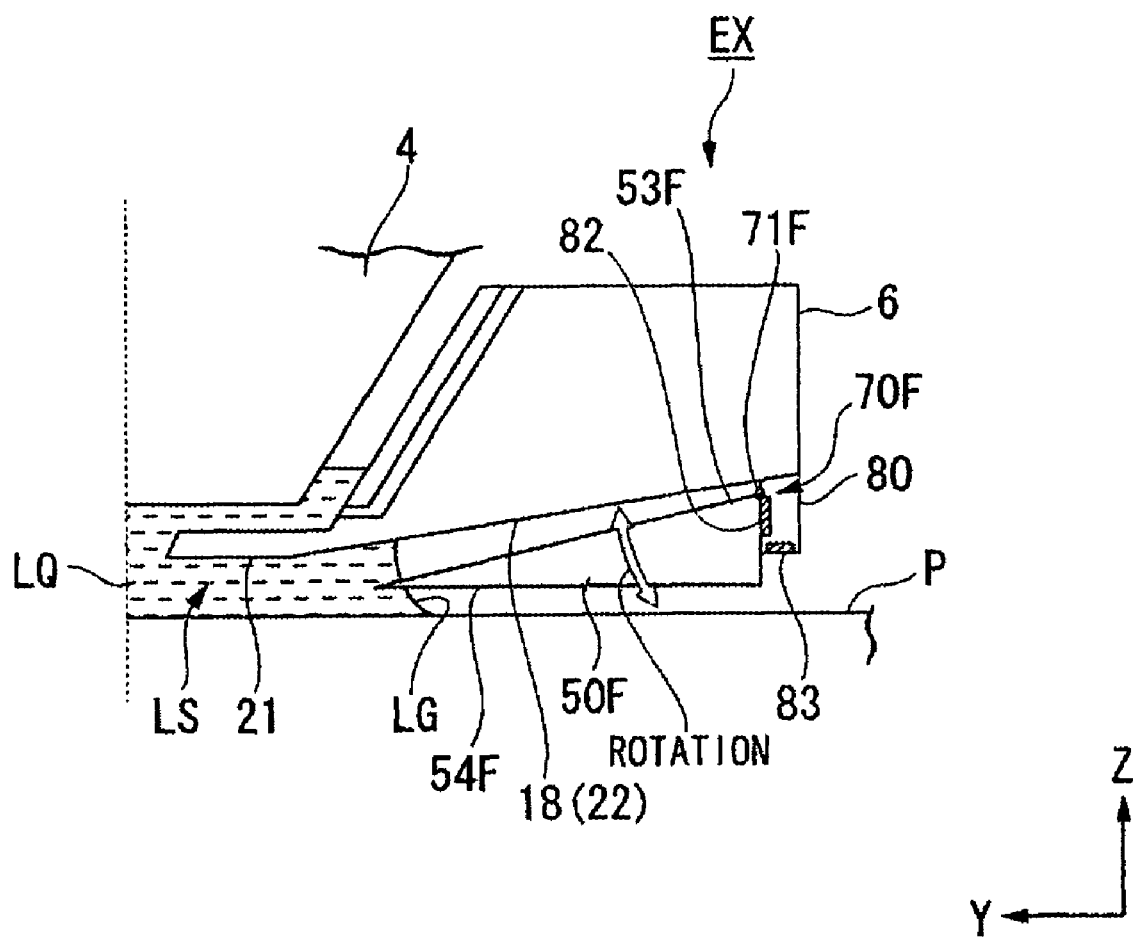
FIG. 16 is a schematic drawing that shows one example of the exposure apparatus according to a second embodiment.
Figure 17:
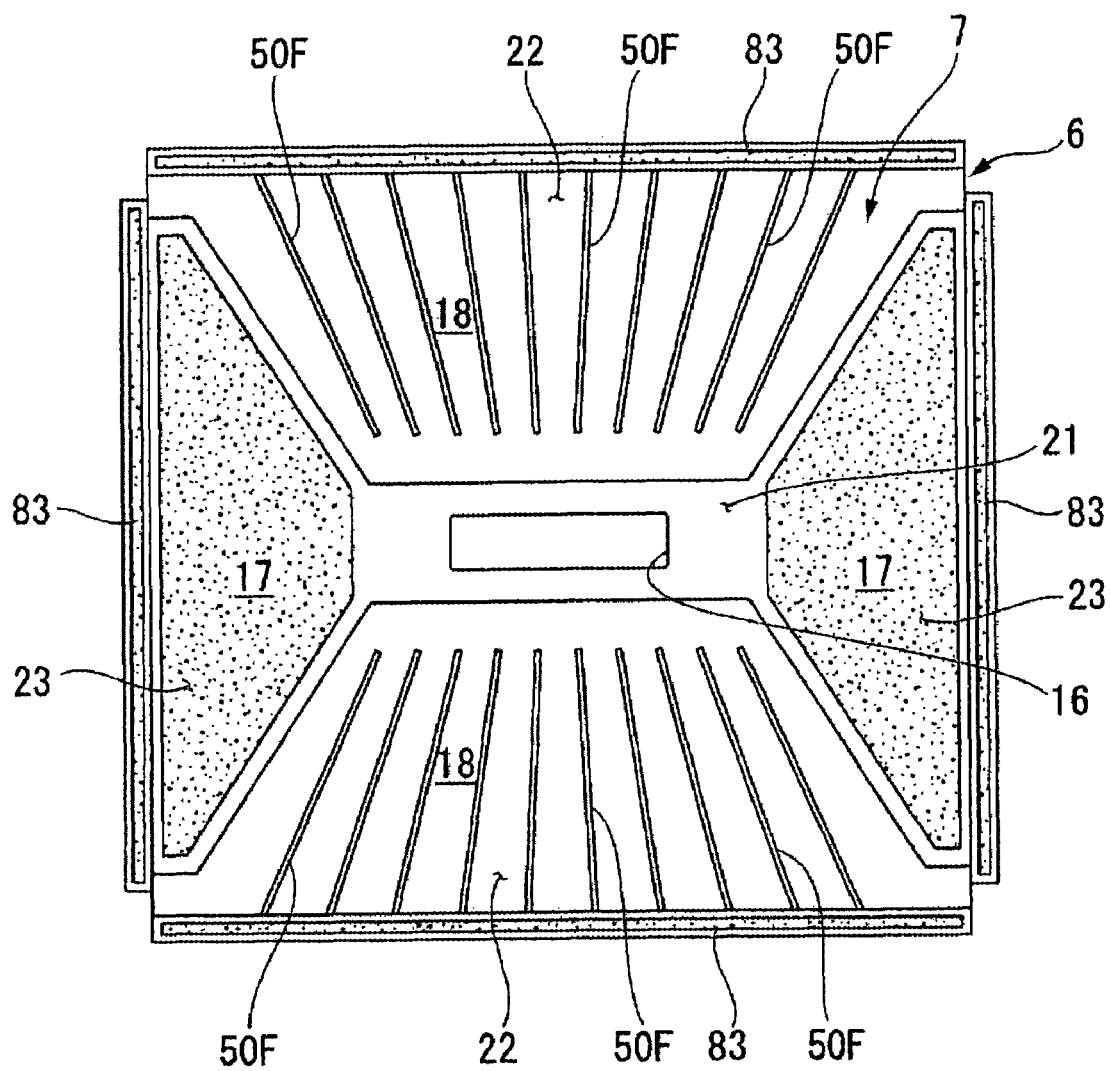
FIG. 17 shows the liquid immersion member according to the second embodiment, viewed from the lower side.

FIG. 16 is a schematic drawing that shows part of the exposure apparatus EX according to the second embodiment, and FIG. 17 shows the liquid immersion member 6 according to the second embodiment, viewed from below (the −Z side). In the present embodiment, fin shaped porous members (trapping mesh members) 50F are disposed at the −Z side of the lower surface 7 of the liquid immersion member 6. In the explanation below, the fin shaped porous members (trapping mesh members) 50F, which are disposed at the −Z side of the lower surface 7 of the liquid immersion member 6, are properly called the fin members 50F.

The fin members 50F are disposed at the −Z side of the liquid nonrecovery areas 18 (the second surfaces 22). As shown in FIG. 17, multiple fin members 50F are disposed radially with respect to the optical path (the optical axis AX)

of the exposure light EL between the front surface of the substrate P and the liquid nonrecovery areas 18 of the liquid immersion member 6.

Figure 18A:
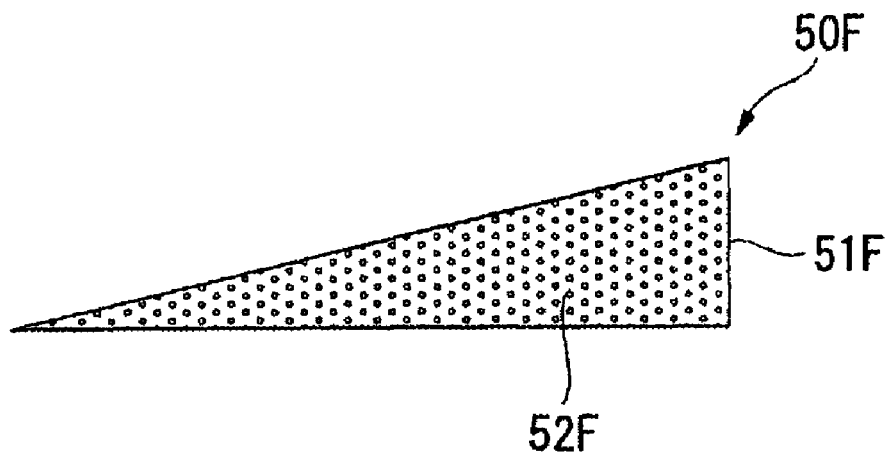
FIG. 18A is an oblique view of the porous member according to the second embodiment.
Figure 18B:
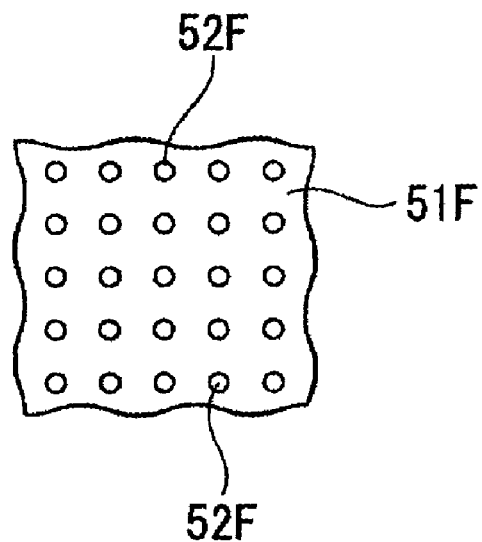
FIG. 18B is an enlarged view of the porous member according to the second embodiment.

FIG. 18A shows one of the fin members 50F, and FIG. 18B is an enlarged view of one of the fin members 50F. As shown in FIGS. 18A and 18B, the fin member 50F comprises a plate 51F, which is formed from a lyophilic material, and a plurality of minute pores 52F, which are formed in the plate 51F. In the present embodiment, the external shape of the plate 51F is substantially triangular. In the present embodiment, the fin members 50F are lyophilic with respect to the liquid LQ.

The liquid LQ can fill the pores 52F of the fin members 50F, and the fin members 50F thereby trap the liquid LQ. Accordingly, bringing the fin members 50F and the liquid LQ into contact makes it possible to make the surfaces of the fin members 50F highly lyophilic.

The exposure apparatus EX comprises support mechanisms 70F, which support the fin members 50F, as shown in FIG. 16. A plurality of the support mechanisms 70F is provided in accordance with the plurality of the fin members 50F. The support mechanisms 70F support the fin members 50F so that they do not contact the substrate P.

Each of the support mechanisms 70F supports an upper end part 53F of the corresponding fin member 50F. The support mechanisms 70F are disposed at the outer edges of the second surfaces 22. At least part of each of the fin members 50F is disposed at a position at which it is closer to the front surface of the substrate P than the first surface 21 is. Each of the support mechanisms 70F supports the corresponding fin member 50F so that a lower end part 54F of that fin member 50F is disposed at the −Z side of the first surface 21.

In addition, each of the support mechanisms 70F comprises a cushioning mechanism 71F, which absorbs forces that are applied to the corresponding fin member 50F. Each of the cushioning mechanisms 71F comprises, for example, a rotary mechanism that supports the upper end part 53F of the corresponding fin member 50F so that it is rotatable in the ΘX directions. Even if one of the fin members 50F contacts the substrate P, the substrate stage 2, or the like, it is possible to prevent the substrate P, the substrate stage 2, or the like from being affected because that fin member 50F is rotated (moved) by the corresponding cushioning mechanism 71F. In addition, even if one of the fin members 50F contacts the substrate P, the substrate stage 2, or the like, it is possible to prevent vibrations from being generated because that fin member 50F rotates (moves). Accordingly, it is also possible to prevent the liquid immersion member 6, the projection optical system PL, or the like from being affected.

In the present embodiment as well, the liquid LQ from the supply ports 31 contacts the fin members 50F prior to the exposure of the substrate P, and therefore the surfaces of the fin members 50F become highly lyophilic.

Making the surfaces of the fin members 50F highly lyophilic makes it possible to perform an immersion exposure on the substrate P while preventing the liquid LQ from leaking, remaining behind, and the like, the same as in the first embodiment discussed above.

Figure 19:
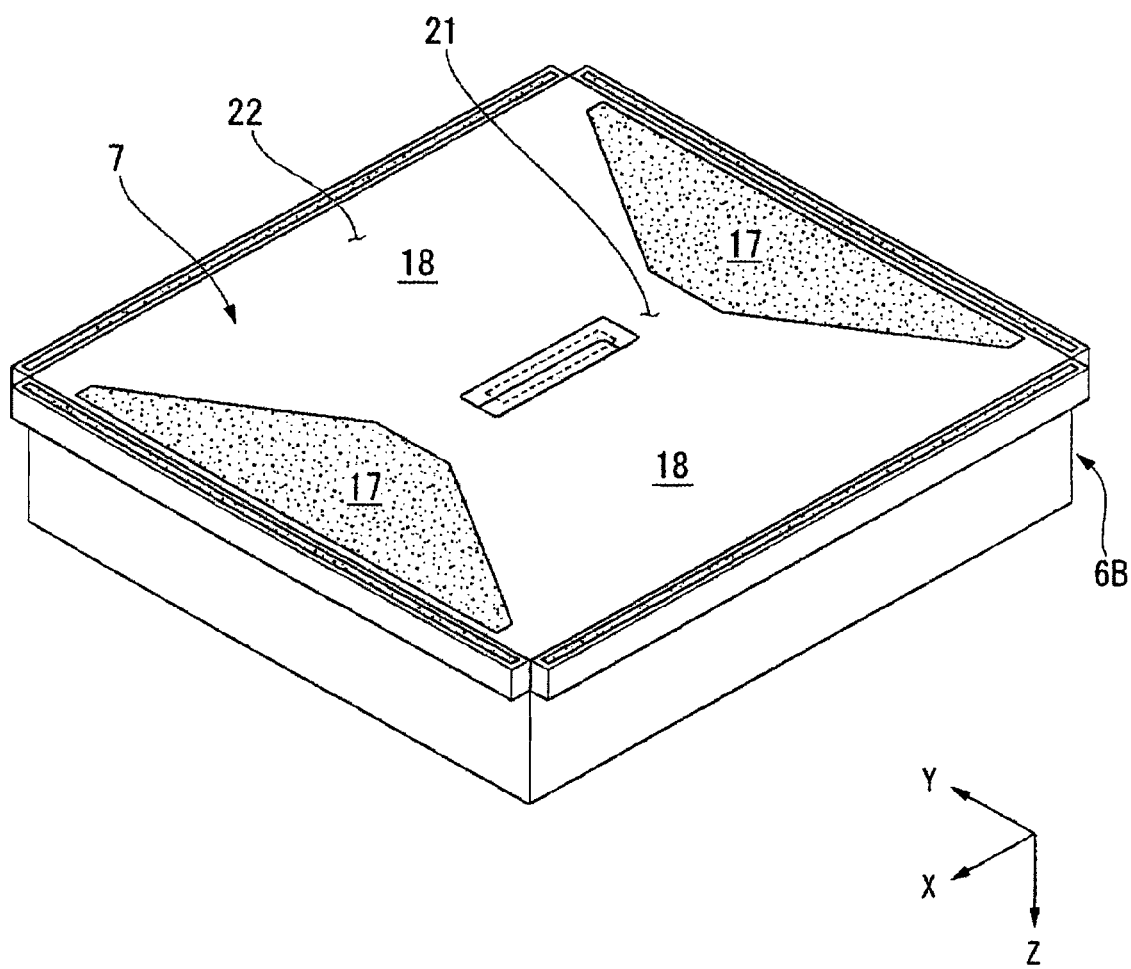
FIG. 19 is an oblique view of another example of the liquid immersion member, viewed from the lower side.

Furthermore, the second surfaces 22 and the first surface 21 in the first and second embodiments discussed above may be disposed within the same plane, as shown in FIG. 19. In the example shown in FIG. 19, the lower surface 7 of the liquid immersion member 6B comprises the first surface 21, which is disposed around the optical path of the exposure light EL, and the second surface 22, which is disposed around the first surface 21. In FIG. 19, the second surface 22 includes the liquid recovery areas 17 and the liquid nonrecovery areas 18. The liquid nonrecovery areas 18 are disposed at opposite sides of the optical path of the exposure light EL in the Y axial directions (the scanning directions of the substrate P). The trapping mesh members 50 are disposed at positions at which they are closer to the front surface of the substrate P than the first surface 21 and the second surface 22 are. In the state shown in FIG. 19 as well, it is possible to prevent the liquid LQ from, for example, leaking or remaining behind, and thereby to prevent exposure failures from occurring.

In addition, in each of the embodiments discussed above, the liquid recovery areas 17 are disposed at opposite sides of the optical path of the exposure light EL in the X axial directions, but they may be disposed around the optical path of the exposure light EL. For example, one or more liquid recovery areas may be disposed so that they surround the first surface 21 at its outer sides with respect to the optical path of the exposure light EL. In this case, at least part of one or more trapping mesh members may be opposed to the one or more liquid recovery areas. Alternatively, the liquid immersion member 6 may have only one supply port, or more than two supply ports.

Furthermore, with the projection optical system PL in each of the embodiments discussed above, the optical path space K on the emergent side (the image plane side) of the last optical element 4 is filled with the liquid LQ, but it is also possible to adopt a projection optical system wherein the optical path space on the incident side (the object plane side) of the last optical element 4 is also filled with the liquid LQ, as disclosed in PCT International Publication WO2004/019128.

Furthermore, although the liquid LQ in the embodiments discussed above is water, it may be a liquid other than water. It is preferable to use a liquid that is transparent to the exposure light EL, has as high a refractive index as possible, and is stable with respect to the projection optical system PL or the film of the photosensitive material (the photoresist) that forms the front surface of the substrate P as the liquid LQ. It is also possible to use hydro-fluoro-ether (HFE), perfluorinated polyether (PFPE), Fomblin oil, cedar oil, or the like as the liquid LQ. In addition, a liquid that has a refractive index of approximately 1.6 to 1.8 may be used as the liquid LQ. Furthermore, the optical element (the last optical element 4 or the like) of the projection optical system PL that contacts the liquid LQ may for example be formed from quartz (silica), or from fluorite, barium fluoride, strontium fluoride, lithium fluoride, sodium fluoride, or single-crystal materials of other fluoride compounds. Furthermore, the terminus optical element may be formed from materials with a refractive index higher than that of quartz or fluorite (for example 1.6 or higher). As materials with a refractive index of 1.6 or higher, for example, sapphire, germanium dioxide or similar disclosed in PCT International Publication No. WO 2005/059617, or potassium chloride (with a refractive index of approximately 1.75) disclosed in PCT International Publication No. WO 2005/059618, or similar can be used. Furthermore, a thin film having liquid affinity properties and/or a dissolution-preventing function may be formed on a portion of (including at least the contact faces with the liquid) or the entirety of the terminus optical element. Quartz has high affinity to liquid and thus a dissolution preventive film is not necessary therefor. However, as for fluorite, it is preferable that at least a dissolution preventive film be formed thereon. In addition, it is also possible to use various fluids, e.g., a supercritical fluid, as the liquid LQ. As a liquid with refractive index higher than pure water (for example 1.5 or higher), for example isopropanol with a refractive index of approximately 1.50, glycerol (glycerin) with a refractive index of approximately 1.61, and other prescribed liquids having C—H bonds or O—H bonds, as well as hexane, heptane, decane, and other prescribed liquids (organic solvents), as well as decalin (decahydronaphthalene) with a refractive index of approximately 1.60, may be used. Further, as the liquid two or more arbitrary liquids among these liquids may be mixed together and used, or one or more of these liquids may be added to (mixed with) pure water and used. Further, as the liquid, pure water to which $H^+$, $Cs^+$, $K^+$, $CF^-$, $SO_4^{2-}$, $PO_4^{2-}$, or other bases or acids are added (mixed) may be used, or pure water to which an Al oxide or other fine particles have been added (mixed) may be used. Also, as the liquid, it is preferable that a liquid be used which has a low optical absorption coefficient, a small temperature dependence, and which is stable with respect to photosensitive materials (or topcoat films, or anti-reflection films, or similar) applied to the surfaces of the projection optical system and/or substrate. In addition, a topcoat film or similar can be provided on the substrate to protect photosensitive materials or substrates from the liquid.

In addition, if, for example, $F_2$ laser light, which does not transmit through water, is used as the exposure light EL, then a fluid that can transmit the $F_2$ laser light can be used as the liquid LQ, e.g., a fluorine based fluid such as perfluoropolyether (PFPE) or a fluorine based oil. In this case, portions that contact the liquid LQ are lyophilically treated by forming a thin film with, for example, a substance that has a molecular structure that contains fluorine or the like and has low polarity.

Furthermore, the substrate P in each of the embodiments discussed above is not limited to a semiconductor wafer for fabricating semiconductor devices, but can also be adapted to, for example, a glass substrate for display devices, a ceramic wafer for thin film magnetic heads, or the original plate of a mask or a reticle (synthetic quartz or a silicon wafer), film member, and similar that is used by an exposure apparatus. Moreover, substrates are not limited to round shape, but may be rectangular or other shapes.

The exposure apparatus EX can also be adapted to a step-and-scan type scanning exposure apparatus (a scanning stepper) that scans and exposes the pattern of the mask M by synchronously moving the mask M and the substrate P, as well as to a step-and-repeat type projection exposure apparatus (a stepper) that performs full field exposure of the pattern of the mask M with the mask M and the substrate P in a stationary state, and sequentially steps the substrate P.

Furthermore, when performing an exposure with a step-and-repeat system, the projection optical system PL is used to transfer a reduced image of a first pattern onto the substrate P in a state wherein the first pattern and the substrate P are substantially stationary, after which the projection optical system PL may be used to perform full-field exposure of the substrate P, wherein a reduced image of a second pattern partially superposes the transferred first pattern in a state wherein the second pattern and the substrate P are substantially stationary (as in a stitching type full-field exposure apparatus). In addition, the stitching type exposure apparatus can also be adapted to a step-and-stitch type exposure apparatus that transfers at least two patterns onto the substrate P so that they are partially superposed, and sequentially steps the substrate P.

In addition, the present invention can also be adapted to, for example, an exposure apparatus that combines the patterns of two masks on a substrate through a projection optical system and double exposes, substantially simultaneously, a single shot region on the substrate using a single scanning exposure, as disclosed in, for example, Published Japanese Translation No. 2004-519850 of the PCT International Publication (corresponding U.S. Pat. No. 6,611,316). In addition, the present invention can also be adapted to, for example, a proximity type exposure apparatus and a mirror projection aligner.

In addition, the present invention can also be adapted to a twin stage type exposure apparatus that is provided with a plurality of substrate stages, as disclosed in, for example, Japanese Patent Application Publication No. H10-163099A, Japanese Patent Application Publication No. H10-214783A, Published Japanese Translation No. 2000-505958 of the PCT International Publication, U.S. Pat. No. 6,341,007, U.S. Pat. No. 6,400,441, U.S. Pat. No. 6,549,269, U.S. Pat. No. 6,590,634, U.S. Pat. No. 6,208,407, and U.S. Pat. No. 6,262,796.

Furthermore, the present invention can also be adapted to an exposure apparatus that is provided with a substrate stage that holds a substrate and a measurement stage whereon various photoelectric sensors and/or a fiducial member, wherein a fiducial mark is formed, are mounted, as disclosed in, for example, Japanese Patent Application Publication No. H11-135400A (corresponding PCT International Publication WO1999/23692), and Japanese Patent Application Publication No. 2000-164504 (corresponding U.S. Pat. No. 6,897,963). In addition, the present invention can also be adapted to an exposure apparatus that comprises a plurality of substrate stages and measurement stages. Disposing the measurement stage at a position at which it opposes the emergent surface of the last optical element and the lower surface of the liquid immersion member makes it possible to form the immersion space between the last optical element and the liquid immersion member on one side and the measurement stage on the other side.

The type of exposure apparatus EX is not limited to a semiconductor device fabrication exposure apparatus that exposes the substrate P with the pattern of a semiconductor device, but can also be widely adapted to exposure apparatuses that are used for fabricating, for example, liquid crystal devices or displays, and to exposure apparatuses that are used for fabricating thin film magnetic heads, image capturing devices (CCDs), micromachines, MEMS devices, DNA chips, or reticles and masks.

Furthermore, in each of the embodiments discussed above, the positional information of the mask stage 1 and the substrate stage 2 is measured using an interferometer system that comprises the laser interferometers 1S, 2S, but the present invention is not limited thereto; for example, an encoder system may be used that detects a scale (diffraction grating) that is provided to each of the stages 1, 2. In this case, the system is preferably configured as a hybrid system that is provided with both an interferometer system and an encoder system, and it is preferable to use the measurement results of the interferometer system to calibrate the measurement results of the encoder system. In addition, the position of the stages may be controlled by switching between the interferometer system and the encoder system, or by using both.

In addition, in each of the embodiments discussed above, an ArF excimer laser may be used as the light source apparatus that generates ArF excimer laser light, which serves as the exposure light EL; however, as disclosed in, for example, PCT International Publication WO 1999/46835 (corresponding U.S. Pat. No. 7,023,610), a harmonic generation apparatus may be used that outputs pulsed light with a wavelength of 193 nm and that comprises: an optical amplifier part, which has a solid state laser light source (such as a DFB semiconductor laser or a fiber laser), a fiber amplifier, and the like; and a wavelength converting part. Furthermore, in the abovementioned embodiments, both the illumination region and the projection region are rectangular, but they may be some other shape, e.g., arcuate.

Furthermore, in each of the embodiments discussed above, a light transmitting type mask is used wherein a prescribed shielding pattern (or a phase pattern or a dimming pattern) is formed on a light transmitting substrate; however, instead of such a mask, a variable forming mask (also called an electronic mask, an active mask, or an image generator), wherein a transmittance pattern, a reflected pattern, or a light emitting pattern is formed based on electronic data of the pattern to be exposed, may be used as disclosed in, for example, U.S. Pat. No. 6,778,257. The variable forming mask comprises a digital micromirror device (DMD), which is one kind of non-emissive type image display device (also called a Spatial Light Modulator (SLM)). The exposure apparatus using a DMD is disclosed for example in U.S. Pat. No. 6,778,257. In addition, the variable forming mask is not limited to a DMD, and a non-emissive type image display device, which is explained below, may be used instead. Here, the non-emissive type image display device is a device that spatially modulates the amplitude (the intensity), the phase, or the polarization state of the light that travels in a prescribed direction; furthermore, examples of a transmissive type spatial light modulator include a transmissive type liquid crystal display (LCD) as well as an electrochromic display (ECD). In addition, examples of a reflecting type spatial light modulator include a DMD, which was discussed above, as well as a reflecting mirror array, a reflecting type LCD, an electrophoretic display (EPD), electronic paper (or electronic ink), and a grating light valve.

In addition, instead of a variable forming mask that is provided with a non-emissive type image display device, a pattern forming apparatus that comprises a self luminous type image display device may be provided. In this case, an illumination system is not necessary. Here, examples of a self luminous type image display device include a cathode ray tube (CRT), an inorganic electroluminescence display, an organic electroluminescence display (OLED: organic light emitting diode), an LED display, an LD display, a field emission display (FED), and a plasma display (PDP: plasma display panel). In addition, a solid state light source chip that has a plurality of light emitting points or that creates a plurality of light emitting points on a single substrate, a solid state light source chip array wherein a plurality of chips are arrayed, or the like may be used as the self luminous type image display device that constitutes the pattern forming apparatus, and the pattern may be formed by electrically controlling the solid state light source chip(s). Furthermore, it does not matter whether the solid state light source device is inorganic or organic.

Each of the embodiments discussed above explained an exemplary case of an exposure apparatus that is provided with the projection optical system PL, but the present invention can be adapted to an exposure apparatus and an exposing method that do not use the projection optical system PL. Thus, even if the projection optical system PL is not used, the exposure light is radiated onto the substrate through optical members, e.g., lenses, and an immersion space is formed in a prescribed space between the substrate and those optical members.

In addition, by forming interference fringes on the substrate P as disclosed in, for example, PCT International Publication WO2001/035168, the present invention can also be adapted to an exposure apparatus (a lithographic system) that exposes the substrate P with a line-and-space pattern.

Furthermore, the requirements of each of the embodiments discussed above can be appropriately combined. As far as is permitted, each disclosure of every published document and U.S. patent related to the exposure apparatus recited in each of the embodiments discussed above, modified examples, and the like is hereby incorporated by reference.

As described above, the exposure apparatus EX of the embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 20:
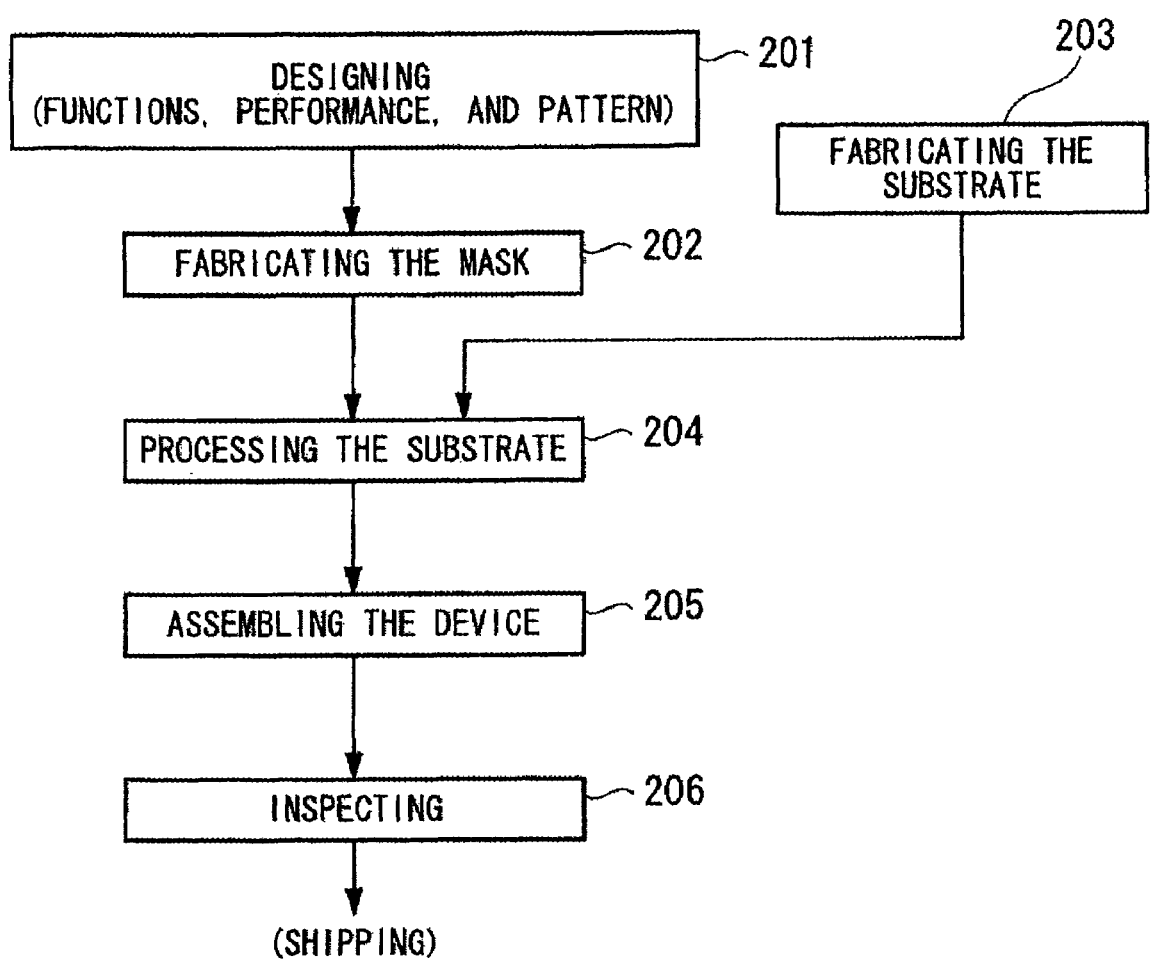
FIG. 20 is a flow chart diagram that depicts one example of a process of fabricating a microdevice.

As shown in FIG. 20, a micro-device, such as a semiconductor device, is manufactured by: a step 201 that designs the functions and performance of the micro-device; a step 202 that fabricates a mask (a reticle) based on this designing step; a step 203 that fabricates a substrate, which is the base material of the device; a substrate processing step 204 that comprises a substrate process (exposure process) that includes, in accordance with the embodiments discussed above, exposing the substrate with the exposure light using the mask pattern and developing the exposed substrate; a device assembling step 205 (which includes fabrication processes such as dicing, bonding, and packaging processes); an inspecting step 206; and the like.

What is claimed is:

1. A liquid immersion exposure apparatus comprising:
   a projection system having an optical element, a substrate positioned below the projection system being exposed with exposure light;
   a liquid immersion member which has a liquid contact surface that opposes a front surface of an object and that includes a liquid recovery area, a liquid in a gap between the liquid contact surface of the liquid immersion member and the front surface of the object being recovered through the liquid recovery area; and
   a porous member, which is disposed below the liquid contact surface, the object being moved below the projection system, the liquid immersion member, and the porous member; wherein
   the porous member and the liquid contact surface are configured to provide a space between the porous member and the liquid contact surface of the liquid immersion member, and
   the porous member and the liquid contact surface are configured to provide an opening located below the liquid contact surface of the liquid immersion member and above the porous member, through which the liquid is allowed to flow into the space.

2. An exposure apparatus according to claim 1, wherein the liquid contact surface has:

a first surface, which is disposed around an optical path of the exposure light; and a second surface, which is disposed at an outer side of the first surface with respect to the optical path of the exposure light.

3. An exposure apparatus according to claim 2, wherein the second surface is disposed around the first surface.

4. An exposure apparatus according to claim 2, wherein the liquid contact surface includes a liquid non-recovery area; and the porous member is disposed at the first side of the liquid non-recovery area.

5. An exposure apparatus according to claim 4, wherein the substrate is exposed while moving with respect to the optical path in a direction that intersects the optical path; and the liquid non-recovery area is disposed at opposite sides of the optical path in the direction.

6. An exposure apparatus according to claim 4, wherein the liquid non-recovery area is disposed at a position at which the liquid non-recovery area is further from the front surface of the object than the first surface is.

7. An exposure apparatus according to claim 6, wherein the liquid non-recovery area is inclined so that the liquid non-recovery area becomes gradually spaced apart from the front surface of the object along a direction that leads away from the optical path.

8. An exposure apparatus according to claim 2, wherein the second surface is disposed at a position at which the second surface is further from the front surface of the object than the first surface is.

9. An exposure apparatus according to claim 2, wherein the first surface is substantially parallel to the front surface of the object.

10. An exposure apparatus according to claim 2, wherein at least part of the porous member is disposed at a position at which the porous member is closer to the front surface of the object than the first surface is.

11. An exposure apparatus according to claim 1, wherein the liquid immersion member further comprises a liquid supply port for supplying the liquid.

12. An exposure apparatus according to claim 1, wherein the liquid can flow into the space without going through the porous member.

13. An exposure apparatus according to claim 1, wherein the porous member opposes at least part of the liquid contact surface.

14. An exposure apparatus according to claim 1, wherein the porous member comprises a fin shaped member.

15. An exposure apparatus according to claim 1, wherein the substrate is exposed while moving with respect to an optical path in a direction that intersects the optical path; and the porous member is disposed at opposite sides of at least the optical path in the direction.

16. An exposure apparatus according to claim 1, wherein the porous member comprises a plate shaped member.

17. An exposure apparatus according to claim 16, wherein the plate shaped member is elastically deformable.

18. An exposure apparatus according to claim 1, further comprising:

a cushioning mechanism that absorbs a force that is applied to the porous member.

19. An exposure apparatus according to claim 1, further comprising:

a gas supply port that supplies a gas to the porous member.

20. An exposure apparatus according to claim 1, wherein the porous member comprises a mesh.

21. An exposure apparatus according to claim 1, wherein at least a part of the porous member is lyophilic with respect to the liquid.

22. An exposure apparatus according to claim 1, wherein the object comprises the substrate.

23. A device fabricating method, comprising:

exposing a substrate using an exposure apparatus according to claim 1; and developing the exposed substrate.

24. An exposure apparatus that exposes a substrate with exposure light through a liquid, comprising:

a liquid supply port that supplies the liquid;

a liquid immersion member which has a liquid contact surface; and a porous member, which opposes the liquid contact surface of the liquid immersion member and which is disposed between the liquid contact surface and an object being moved below the liquid immersion member; wherein the porous member and the liquid contact surface are configured to provide a space between the liquid contact surface of the liquid immersion member and the porous member, into which at least part of the liquid that is supplied from the liquid supply port can flow without going through the porous member.

25. An exposure apparatus according to claim 24, wherein the liquid supply port is provided to the liquid immersion member.

26. An exposure apparatus according to claim 24, wherein the substrate is exposed while moving with respect to an optical path in a prescribed direction that intersects the optical path; and the porous member is disposed at opposite sides of at least the optical path in the prescribed direction.

27. An exposure apparatus according to claim 24, wherein the porous member comprises a plate shaped member.

28. An exposure apparatus according to claim 27, wherein the plate shaped member is elastically deformable.

29. An exposure apparatus according to claim 24, further comprising:

a cushioning mechanism that absorbs a force that is applied to the porous member.

30. An exposure apparatus according to claim 24, further comprising:

a gas supply port that supplies a gas to the porous member.

31. An exposure apparatus according to claim 24, wherein the porous member comprises a mesh.

32. An exposure apparatus according to claim 24, wherein at least a part of the porous member is lyophilic with respect to the liquid.

33. A device fabricating method, comprising:

exposing a substrate using an exposure apparatus according to claim 24; and developing the exposed substrate.

34. An immersion system that is used by an immersion exposure apparatus, which exposes a substrate with exposure light from an optical member, to fill an optical path of the exposure light between the optical member and the substrate with a liquid, comprising:

a liquid immersion member which has a liquid contact surface that opposes a front surface of an object and that includes a liquid recovery area, a liquid in a gap between the liquid contact surface of the liquid immersion member and the front surface of the object being recovered through the liquid recovery area; and a porous member, which is disposed below the liquid contact surface, the object being moved below the liquid immersion member and the porous member; wherein the porous member and the liquid contact surface are configured to provide a space between the porous member and the liquid contact surface of the liquid immersion member, and the porous member and the liquid contact surface are configured to provide an opening located below the liquid contact surface of the liquid immersion member and above the porous member, through which the liquid is allowed to flow into the space.

35. An immersion system according to claim 34, wherein the porous member opposes at least part of the liquid contact surface.

36. An immersion system that is used by an immersion exposure apparatus, which exposes a substrate with exposure light through an optical member, to fill an optical path of the exposure light between the optical member and the substrate with a liquid, comprising:

a liquid supply port that supplies the liquid;

a liquid immersion member which has a liquid contact surface; and a porous member, which opposes the liquid contact surface of the liquid immersion member and which is disposed between the liquid contact surface and an object being moved below the liquid immersion member; wherein the porous member and the liquid contact surface are configured to provide a space between the liquid contact surface of the liquid immersion member and the porous member, into which at least part of the liquid that is supplied from the liquid supply port can flow without going through the porous member.

37. An immersion system that is used by an immersion exposure apparatus, which exposes a substrate with exposure light through an optical member, to fill an optical path of the exposure light between the optical member and the substrate with a liquid, comprising:

a liquid immersion member which has a liquid contact surface that opposes a front surface of an object and that includes a liquid recovery area; and a film forming member, which is disposed between the liquid contact surface and the object, that forms a thin film of the liquid so that the film forming member opposes the object, wherein, the liquid on the object, which is disposed adjacent to the liquid contact surface, is recovered from the liquid recovery area.

38. An exposing method that exposes a substrate with exposure light through a liquid, the method comprising:

disposing the substrate adjacent to a liquid immersion member which has a liquid contact surface that opposes a top surface of the substrate, the liquid contact surface including a liquid recovery area and a liquid non-recovery area;

holding part of the liquid that is supplied from a liquid supply port between the liquid contact surface and the substrate using a porous member, which is positioned between the liquid contact surface and the substrate; and recovering the liquid on the substrate from the liquid recovery area.

39. An exposing method according to claim 38, wherein at least part of a space between the liquid contact surface and the porous member is filled with the liquid that is supplied via the liquid supply port.

40. An exposing method according to claim 38, wherein the liquid from the liquid supply port is brought to the porous member prior to the exposure of the substrate.

41. An exposing method according to claim 40, the method further comprising:

making the surface of the porous member lyophilic by bringing the liquid to the porous member prior to the exposure of the substrate.

42. An exposing method according to claim 38, the method further comprising:

drying the porous member at least when no substrate is being exposed.

43. A device fabricating method, comprising:

exposing the substrate using an exposing method according to claim 38; and developing the exposed substrate.

* * * * *